(12) United States Patent
Kukal et al.

(10) Patent No.: US 8,898,039 B1
(45) Date of Patent: Nov. 25, 2014

(54) PHYSICAL TOPOLOGY-DRIVEN LOGICAL DESIGN FLOW

(75) Inventors: Taranjit Singh Kukal, Delhi (IN); Nikhil Gupta, New Delhi (IN); Steve Durrill, Campbell, CA (US); Vikrant Khanna, Noida (IN); Dingru Xiao, Shanghai (CN)

(73) Assignee: Cadence Design Systems, Inc., San Jose, CA (US)

( * ) Notice: Subject to any disclaimer, the term of this patent is extended or adjusted under 35 U.S.C. 154(b) by 1053 days.

(21) Appl. No.: 12/422,941

(22) Filed: Apr. 13, 2009

(51) Int. Cl.
*G06F 17/50* (2006.01)

(52) U.S. Cl.
USPC ............................................. 703/1

(58) Field of Classification Search
USPC ............................................. 703/1; 716/110
See application file for complete search history.

(56) References Cited

U.S. PATENT DOCUMENTS

| | | | |
|---|---|---|---|
| 6,920,620 B2 * | 7/2005 | Hsiao et al. | 716/112 |
| 2005/0120319 A1 * | 6/2005 | van Ginneken | 716/6 |
| 2005/0278670 A1 * | 12/2005 | Brooks et al. | 716/5 |
| 2007/0245274 A1 * | 10/2007 | Kimura | 716/4 |

* cited by examiner

*Primary Examiner* — Omar Fernandez Rivas
*Assistant Examiner* — Bernard E Cothran
(74) *Attorney, Agent, or Firm* — Rosenberg, Klein & Lee

(57) ABSTRACT

A design system provides data structures to store parameters of physical structures that can be viewed and modified through a graphical design interface. Certain of the structures of the physical system may be partitioned into a subsystem such that the data describing the subsystem includes physical topology data defining relative locations of the structures in the physical system. The physical topology data is back-annotated into a logical topology, such as in accordance with a predefined logical topology template. The logical data abstraction of the circuit design is kept synchronized with the physical data and presented in a logical topology that is kept legible through the prudent selection of logical topologies representing the physical subsystem design.

27 Claims, 21 Drawing Sheets

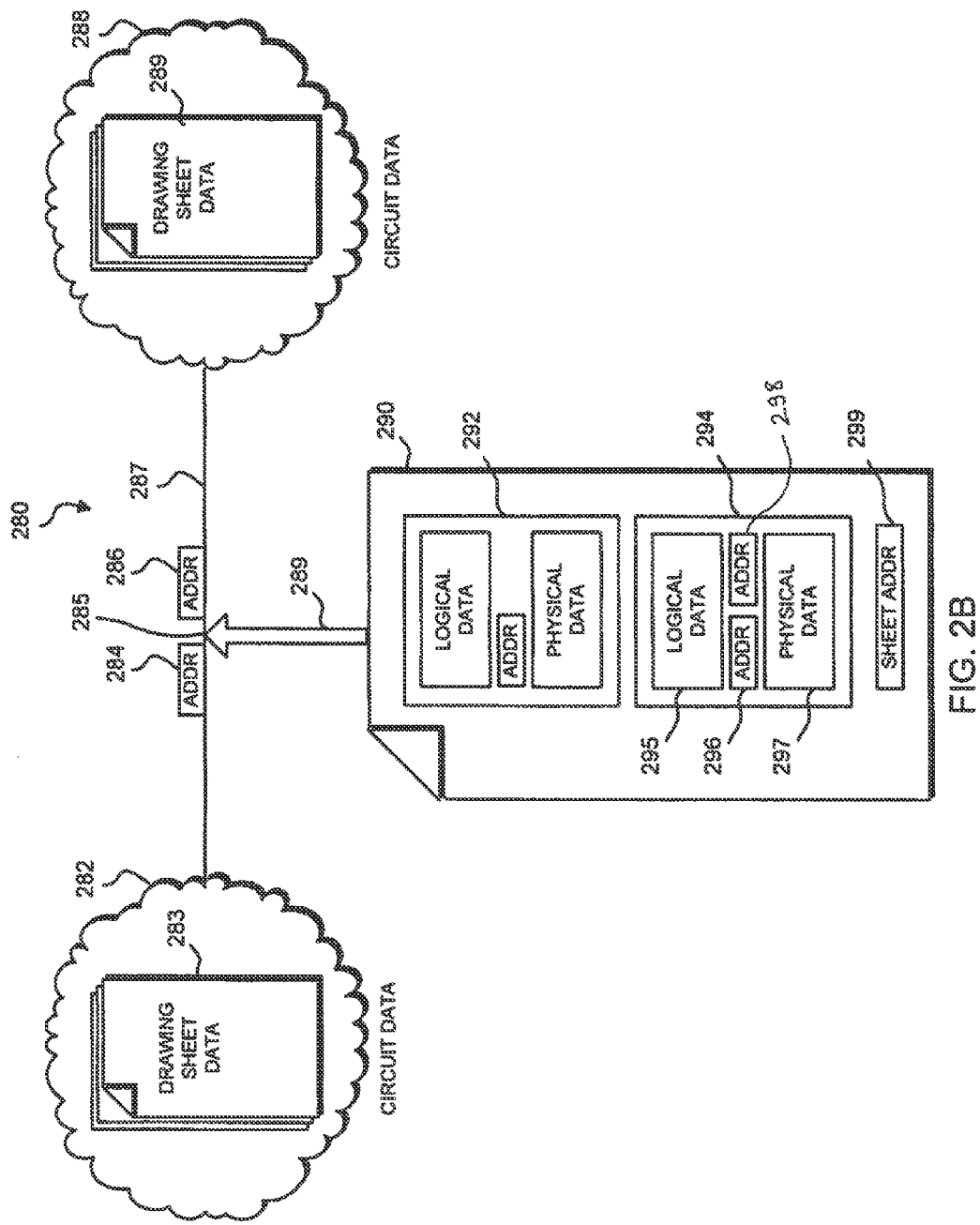

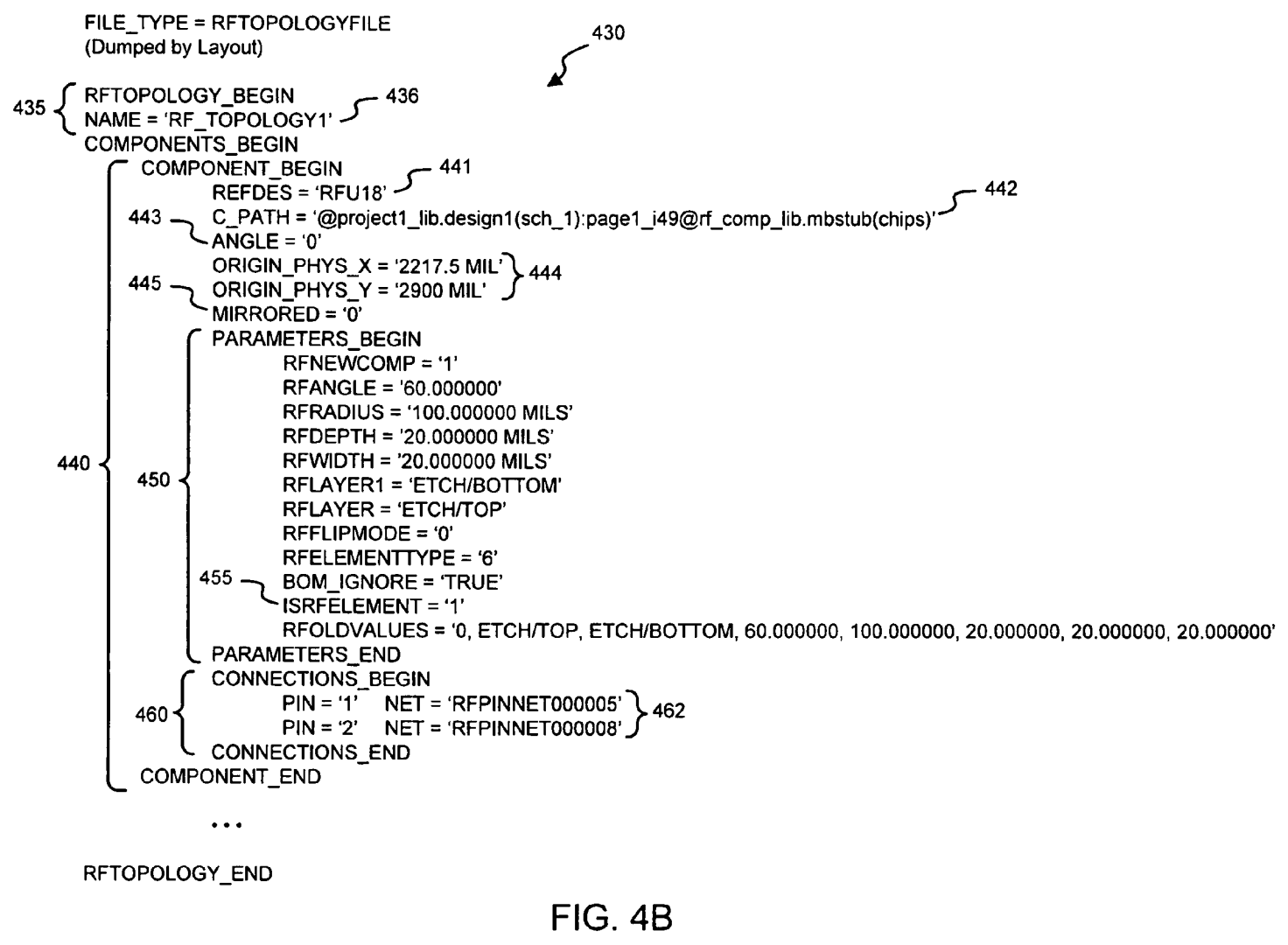

```
FILE_TYPE = RFTOPOLOGYFILE
(Dumped by Layout)

⟵ 430
      ⎧  RFTOPOLOGY_BEGIN          ⟵ 436
  435 ⎨    NAME = 'RF_TOPOLOGY1'
      ⎩    COMPONENTS_BEGIN
              COMPONENT_BEGIN       ⟵ 441
                REFDES = 'RFU18'                                                                        ⟵ 442
         443 ⎰  C_PATH = '@project1_lib.design1(sch_1):page1_i49@rf_comp_lib.mbstub(chips)'
              ⎱ ANGLE = '0'                                         ⟵ 444
         445 ⎰  ORIGIN_PHYS_X = '2217.5 MIL'
              ⎱ ORIGIN_PHYS_Y = '2900 MIL'
                MIRRORED = '0'
                PARAMETERS_BEGIN
                  RFNEWCOMP = '1'
                  RFANGLE = '60.000000'
                  RFRADIUS = '100.000000 MILS'
       ⎧          RFDEPTH = '20.000000 MILS'
       ⎪          RFWIDTH = '20.000000 MILS'
       ⎪          RFLAYER1 = 'ETCH/BOTTOM'
  440 ⎨           RFLAYER2 = 'ETCH/TOP'
       ⎪          RFFLIPMODE = '0'
       ⎪          RFELEMENTTYPE = '6'
       ⎪    455 ⎰ BOM_IGNORE = 'TRUE'
       ⎪         ⎱ ISRFELEMENT = '1'
       ⎪          RFOLDVALUES = '0, ETCH/TOP, ETCH/BOTTOM, 60.000000, 100.000000, 20.000000, 20.000000, 20.000000'
       ⎪        PARAMETERS_END
       ⎪        CONNECTIONS_BEGIN                       ⟵ 462
  460 ⎨           PIN = '1'   NET = 'RFPINNET000005'
       ⎪          PIN = '2'   NET = 'RFPINNET000008'
       ⎩        CONNECTIONS_END
              COMPONENT_END
              ⋮
      RFTOPOLOGY_END
```

FIG. 4B

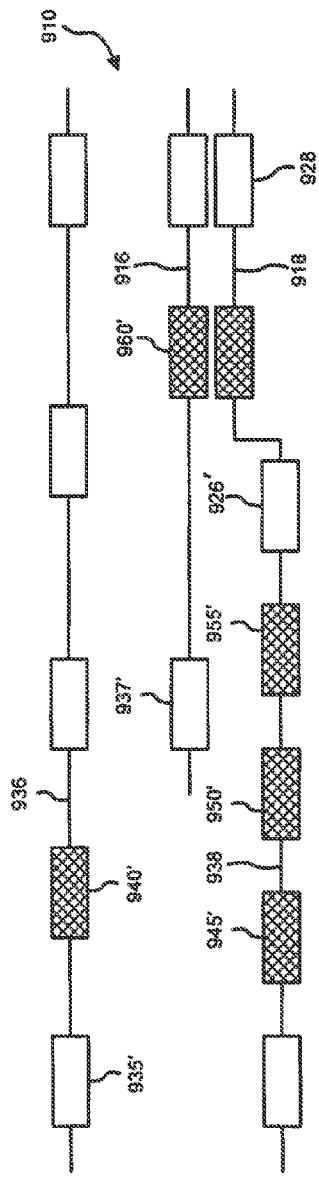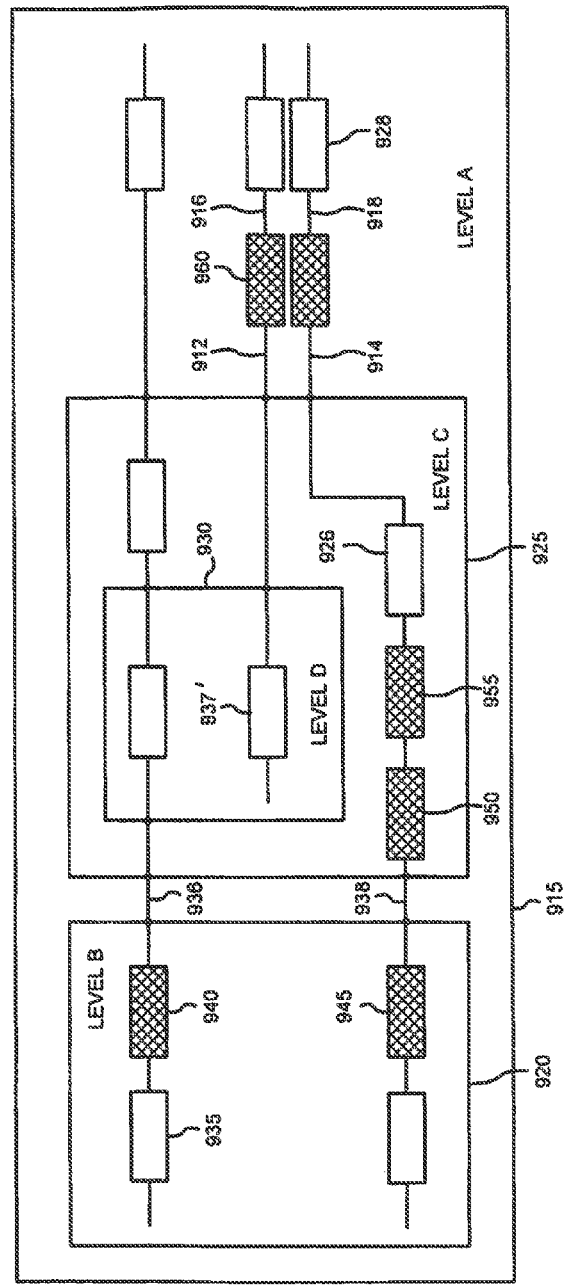

PHYSICAL TOPOLOGY-DRIVEN LOGICAL DESIGN FLOW

BACKGROUND

The general inventive concept described herein pertains to engineering design of physical systems by way of machine operations and by interaction with the machine by a user, typically a system designer. As used herein, a physical system is a set of components interconnected in a particular configuration so as to interoperate in a common purpose. It is to be understood that a system may include sub-systems that themselves meet the criteria of a physical system.

Engineering design, broadly, across the many engineering disciplines, involves the selective interconnection of various system components to transfer energy, or equivalently, to transport matter, therebetween so as to compel a system behavior satisfying a specified design goal. To that end, designers create, modify and analyze a system design in a design environment, such as a computer-aided design (CAD) system, a computer-aided engineering (CAE) system or an electronic design automation (EDA) system through a number of different data abstractions. As used herein, a data abstraction is a mechanism by which a data set is reduced or filtered so that the designer works with an appropriate subset of the data at any one time. For example, certain design tasks require only a subset of a complete data set that corresponds to a context in which the tasks are performed. Accordingly, each design task may have a context in which to perform the task and a data abstraction corresponding to the context in which the task is performed. It is to be understood that design element data underlying different data abstractions thereof refer to the same design element in the system design, but the different data abstractions reveal aspects of the design element that more readily assists the designer to perform different design tasks. For example, designers of electrical circuits may define logical connections and component parameters in a schematic entry context through a logical data abstraction, such as data abstraction presented as a schematic diagram, and may define component placement and physical connections in a layout context through a physical data abstraction, such as a data abstraction presented as a collection of footprints, i.e., the spatial occupancy of the components of the design, laid out as when the components are physically fabricated or assembled. Specific design contexts for physical systems other than electric circuits have corresponding data abstractions that present data in a manner consistent with the physical system or particular engineering design discipline. Generally, logical data abstractions, by which symbolic data of a physical system can be manipulated and physical data abstractions, by which spatial data of the physical system can be manipulated, are implemented in a suitable manner across many physical system design platforms.

As used herein, an operational domain is a set of operating conditions in which and/or by which the physical system is designed to operate. An operational domain may be, for example, atmospheric conditions established by a specific temperature and pressure, or may be a specific operational mode in which the physical system is driven, such as a specific range of electrical signal frequencies driving an electrical circuit. Selection of the operational domain is essential in physical system design since elements from which the physical system is constructed exhibit vastly different behavior across operational domains. Wire segments in an electric circuit, for example, behave according to distributed circuit parameters at frequencies over 500 MHz (referred to collectively herein as radio frequencies, or RF, although the RF operational domain, per se, includes frequencies that are lower than 500 MHz, and frequencies in modern RF circuitry greatly exceed 500 MHz) and behave according to lumped parameters at lower frequencies. As another example, the conduits of a thermodynamic system may have specific dynamic behavior in a particular operational domain, such as high temperature or pressure, which does not manifest itself in other operational domains, such as under standard temperature and pressure (STP) conditions. In varied operational domains, certain parameters of such components, such as the physical dimensions, shape and material from which the components are constructed, have an effect on the energy transfer from one component to another. As such, where these components could be represented in a design system by low-dimensional data (e.g., a single connection between components) in one operational domain, the component data should represent multidimensional properties in an operational domain wherein the components require definition of added parameters in order to function properly in the operational domain. Thus, an automated system design apparatus should afford the system designer with design tools by which the designer may modify the response behavior of components of the physical system, such as by changing the physical structure thereof and/or its surrounding structures. Of course, in doing so, the members connected to the modified components may also require modification so that the system function, as a whole, stays within designed operating tolerances once the change has been made. The design parameters assigned to various elements of a physical system affect system behavior and such assignment is thus an integral part of the design process.

As physical systems become more complex, which is certainly the case for electrical circuits, other design tools are required in a design platform so that the design data is not overwhelming to the designer. Indeed, whereas task automation, for example, has ameliorated certain onerous manual design operations, the designer remains, even today, the key component in a design process. Thus, the degree to which the designer can seamlessly interact with the design apparatus dictates the design time and the expense inherent thereto.

FIG. 1 illustrates a simplified depiction of an exemplary process 100 by which a physical system, in this case an electrical circuit 155, may be physically realized from a design concept 110. The skilled artisan will recognize that the process described with reference to FIG. 1 has similarity to processes that produce physical systems other than electric circuits.

A physical system design typically starts as a concept 110 in the mind of the designer, or designers, represented by designer 115. The designer 115 may interact with a design system 120 to perform various design tasks, as illustrated at interactions 117. By way of the interactions 117 with design system 120, the designer may construct, modify, and verify design data 125 of the physical system 150 that may be ultimately used to fabricate or construct the physical system 150. The design system 120 may be a data processing apparatus executing processing instructions to perform computational, transformational and data presentation processes as directed by the designer 115. Accordingly, a primary function of the design system 120 is to accept input data and design instructions, and present a current state of the design by way of the interactions 117 in a manner that assists the designer in performing the design tasks without losing sight of the design concept 110.

As is illustrated in FIG. 1, the design data 125 may be provided to design data realization system 130, whereby the design data 125 may be processed into a tangible form by which the physical system 150 may be physically fabricated or constructed. The design data realization system 130 produces realization data 135 and provides the realization data to fabrication system 140 by which the physical system 150 is fabricated. The realization data 135 may include data formatted to physically fabricate, for example, circuit component structures 155 on one or more circuit-bearing media 153. Such realization data 135 may include data to construct component and interconnect mask patterns, component placement location data, packaging data, and any other data necessary in a fabrication process to produce the physical system 150, illustrated in FIG. 1 as finished circuit product 150. Other realization data 135 may include milling machine instructions, wiring diagrams, and even blueprints, where the specific form of the realization data is dependent on the physical system 150 being constructed and the fabrication system 140 achieving the construction.

As is known, a machine, in this case the design and fabrication system 118, is not capable of conceptualizing a design 110. Conversely, the designer 115 is not capable of fabricating a complex physical system design, especially when the physical structures forming the physical system are, for example, microscopic, as is the case with modern electrical circuits, without automated processes provided by the machine 100. Thus, a high level of cooperation between a designer 115 and the machine 100 is required to produce complex physical systems. Ultimately, it is in the design of the machine 100 and the mechanisms by which data are transferred between the designer 115 and the machine 100 that dictates the level to which the cooperation is achieved.

Various modern physical systems are extremely complex—comprising numerous complex subsystems spanning multiple technologies. Thus, it is preferable, and often necessary, to partition the overall design into manageable portions. Doing so, however, presents certain challenges, such as synchronizing portions of the design when another portion has been modified and performing simulations and verifications on subsystem designs that rely on other portions of the design still in an earlier design stage. Hence, an incremental design approach, where the portions of the design can be partitioned into small subsystems that are efficiently synchronized with, but verified independently of other portions of the design, can not only decrease the design time, but may also generate reusable portions of the design.

As stated above, certain systems, such as RF circuitry, are performance sensitive to the operational domain in which they operate. In RF circuitry specifically, the physical dimensions and shapes of component structures establish the frequency response of the structure. Thus, prudently designed conductor patterns are used to form functional components in RF circuits, such as capacitors and inductors. In certain design systems, these structures are defined by quantities established during layout. However, functional components are more easily entered into a design during the logical design phase. Moreover, interconnect structures between functional components, at RF frequencies, behave in accordance with parameters established at design time and, as such, incorporating such design elements into a design is more efficiently achieved by way of parameterized components in a schematic data abstraction. Given these mechanisms, the data defining RF circuit designs, and physical systems with analogous requirements, are efficiently managed when partitioned into small sub-circuits, and when the data specifying the sub-circuits can be manipulated through a logical data abstraction thereof.

SUMMARY

The inventive concept described herein pertains to user interaction with a data processing machine to control the presentation of display data, where such interaction is interpreted and used by a data processor or computer architecture having system level elements of computation or data processing techniques prior to use with or in a specific display system. The display data are presented and edited in physical and logical topological contexts.

Additional aspects and utilities of the present inventive concept may be achieved by providing a user-operated machine and concomitant processes to design a physical system of components that interoperate by energy transfer amongst the components. Subsystem design data of at least one subsystem of the physical system may be partitioned from the design data, the partitioned subsystem design data establishing a physical topology specifying the location of each of the member components of the subsystem. A topology template is selected from a plurality of predefined topology templates; each template defines a logical topology specifying relative locations of symbols representing the member components of the subsystem in a logical data abstraction of the subsystem design data. The location of each member component in the physical topology is mapped to a location in the logical topology at which the corresponding symbol is to be located according to the selected topology template. The mapped data may be subsequently stored in a tangible storage medium and/or displayed on a display device.

BRIEF DESCRIPTION OF THE DRAWINGS

The inventive concept disclosed herein is described in conjunction with the accompanying drawings, of which:

FIGS. 2A-2B are diagrams of an exemplary embodiment of the present general inventive concept;

FIG. 4B is an exemplary data structure to store topological data of the extended net illustrated in FIG. 4A;

FIG. 9B is a modified layout data abstraction illustrating the addition of structures to the hierarchical circuit design of FIG. 9A;

FIG. 9C is the hierarchical schematic data abstraction of FIG. 9A in which the added structures are assigned to hierarchical layers in accordance with an embodiment of the present general inventive concept;

DESCRIPTION

Figure 1:
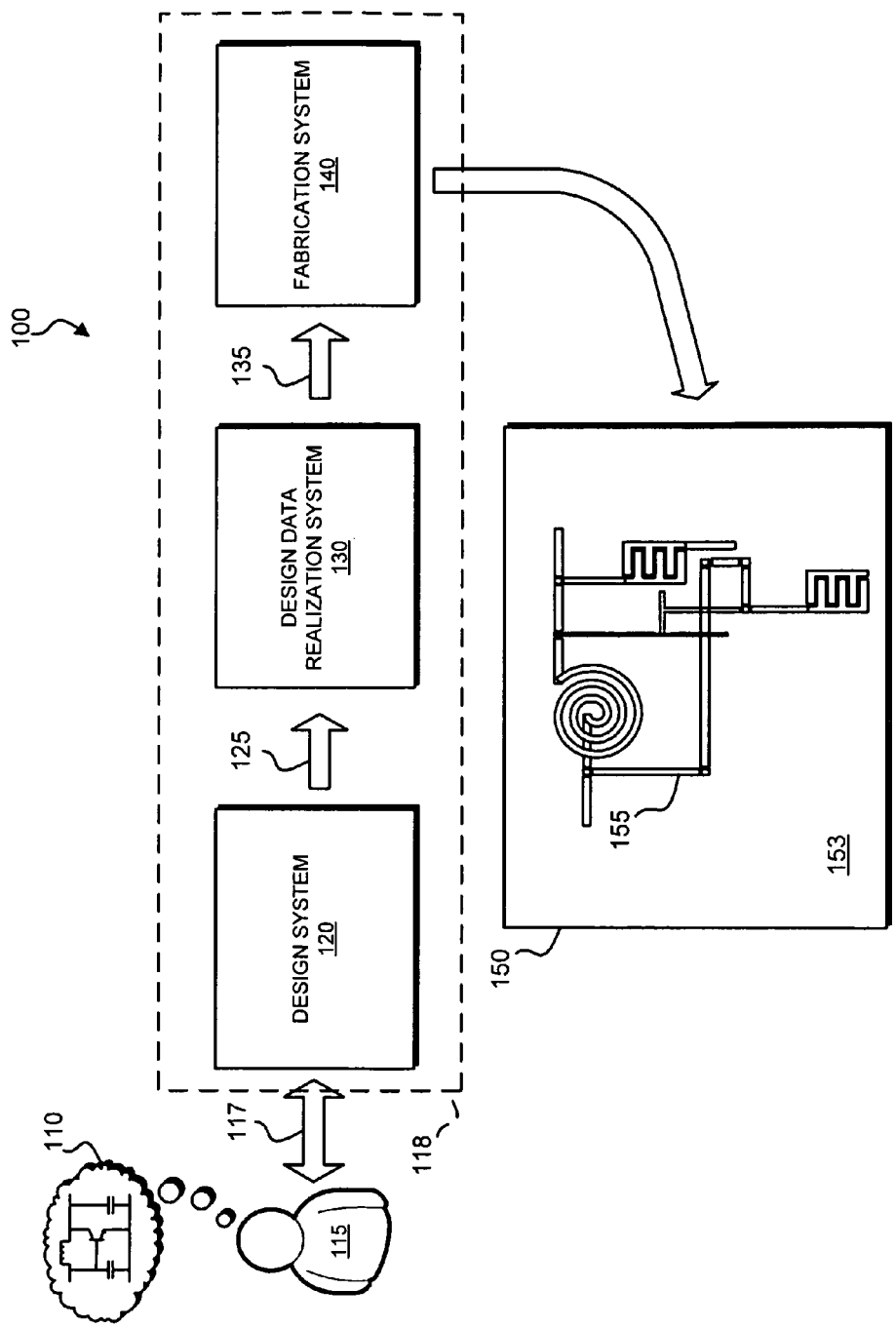
FIG. 1 is a diagram illustrating a typical design and fabrication system to produce physical systems.

Reference will now be made in detail to the embodiments of the present general inventive concept, examples of which are illustrated in the accompanying drawings, wherein like reference numerals refer to the like elements throughout. It is to be understood that the term invention, when used herein, refers to the general inventive concept underlying the exemplary embodiments described below, and that the inventive concept is not limited to such illustrative embodiments themselves.

The present invention may be implemented as a part of a physical system production process, such as of the circuit production process 100 described above. It is to be understood that the present invention is limited neither to any fabricated product nor to any particular production process or the implementation details thereof. Additionally, any suitable fabrication data format may be used with the without deviating from the spirit and intended scope of the present invention.

The present invention will be described now in terms of electrical system design, but it is to be understood that the present invention may be utilized in numerous other physical system design contexts. That is, in the embodiments to be described herein, the system components are electrical components that modify the charge transport therethrough, and the charge is transported from one system component to another system component through structures in a physical medium that, for example, maximize such transport in a given operational domain. It is to be understood that, as used herein, the terms electrical circuit, electrical component, electrical structure, and the like, encompass circuits, components, and structures referred to as electronic circuits, components, and structures and/or active circuits, components, and structures. The present invention, as described below with reference to such electrical systems, may be used to design other systems that have analogous structure and/or design requirements. For example, in a design system to design the mechanical infrastructure of a building, for example, is used to design an electrical subsystem, where the energy is transferred through wires to various lighting fixtures, motors, and elevators, to name a few, and a heating, ventilation, and air conditioning (HVAC) subsystem, where the energy is transferred through ducts and pipes to the heating and cooling load of various rooms in the building, heat exchangers, and heat pumps, for example. In similar fashion to electrical circuits, the mechanical infrastructure may be represented in a physical data abstraction, such as to define the occupancy of various spaces through which the ducts, pipes, wires, etc. are routed, and a logical data abstraction of a topology that is other than that of the physical topology. Moreover, the logical topologies of the various subsystems of the mechanical infrastructure may be such as to convey some user-identifiable characteristic thereof, such as a specific thermodynamic configuration of components of a heat exchange/heat pump heating and cooling system. The skilled artisan will recognize the analogous principles of operation of the mechanical infrastructure described above, and other physical systems, to those of an electrical circuit. As such, the inventive concept described below is applicable to systems to design analogous physical systems in a manner similar to the circuit design system described herein. The scope of the present invention is intended to embrace such application in other design contexts and environments.

Figure 2A:
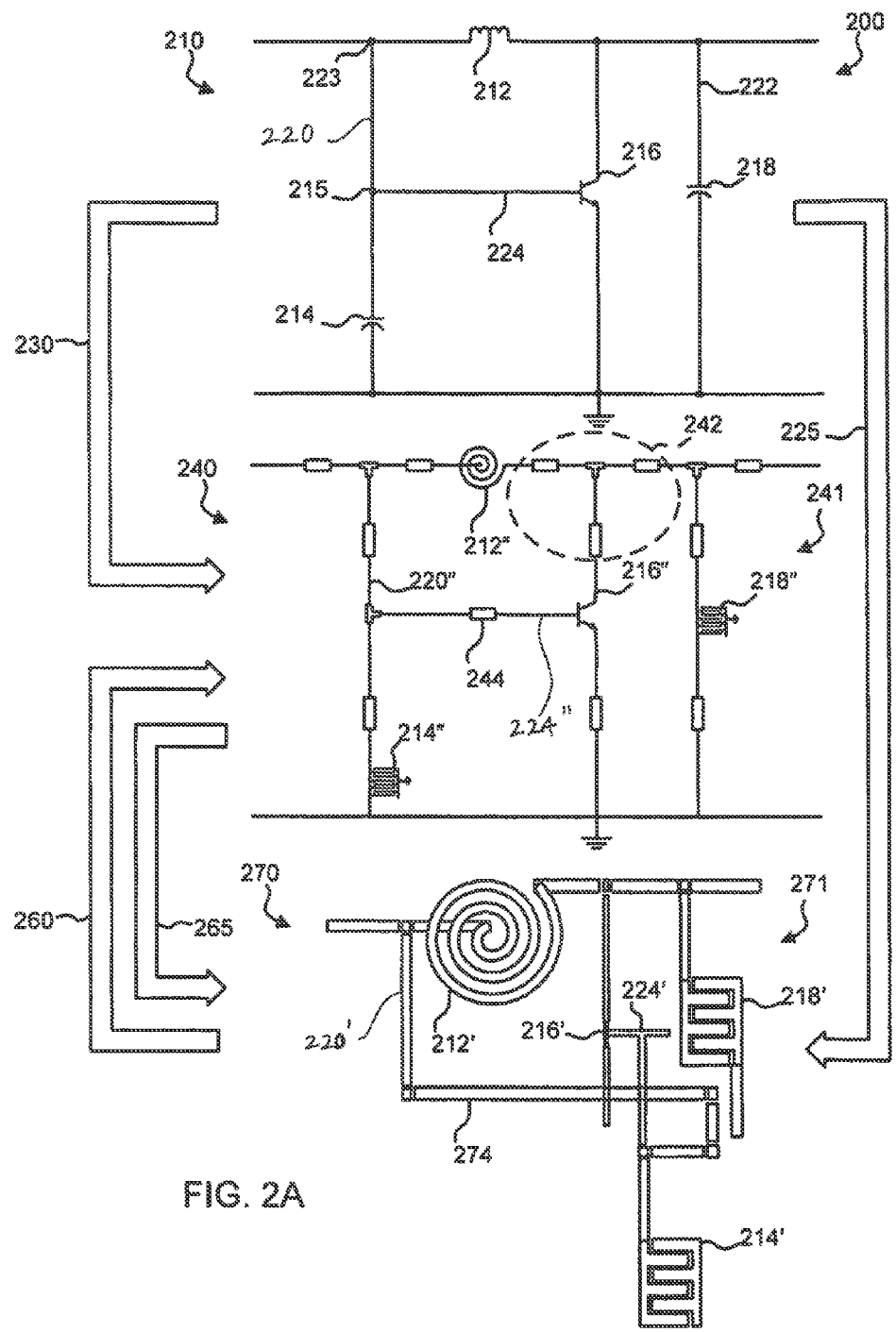

FIG. 2A depicts a simple diagram of an exemplary embodiment of the present invention. The figure depicts three data abstractions of the same exemplary circuit 200: a simple schematic data abstraction 210, a logical data abstraction 240, and a layout data abstraction 270. As used herein, a logical data abstraction, or, alternatively, a schematic data abstraction, is a subset of the circuit design data through which symbolic representations of elements in the circuit design, such as predefined component symbols, lines representing net connections, and other symbolic data, may be presented to and manipulated by the designer. The logical data abstraction may avoid details as to how connections of one component to another component are formed in physical space since, in the logical design phase, such information is not required. On the other hand, a layout data abstraction, or, alternatively, a physical data abstraction, is a subset of the circuit design data by which the spatial features of the circuit design, such as the spatial arrangement and spatial occupancy of components, geometric conductor patterns of the physical connections between the components, component spacing, and other spatial information, may be presented to and manipulated by the designer.

Collectively, the underlying data common to all data abstractions of a particular electrical circuit will be referred to herein as circuit data, or, alternatively, design data, and, in the exemplary embodiment of FIG. 2, the circuit data will be referred to as circuit data 200. Exemplary circuit data 200 includes all of the underlying data across all data abstractions 210, 240, and 270. Alternatively, the circuit data 200 will be referred to simply as the circuit 200, where any distinctions between the underlying data and the system being represented by the underlying data will be clear from the context in which the terms are used.

It is to be understood that an action on one data abstraction 210, 240, and 270 is an action on the underlying data 200 as a whole and other data abstractions 210, 240, and 270 may have to be updated to reflect the action. Such an update is referred to as forward-annotation when information is provided from a data abstraction corresponding to an earlier design stage, such as a schematic entry design stage, to a data abstraction corresponding to a later design stage, such as a layout design stage. Conversely, back-annotation refers to providing information from a data abstraction corresponding to later stages of the design process to earlier stages of the design process.

The data abstractions 210, 240, and 270 may be presented to a designer through, for example, graphic elements displayed on a user interface of an EDA system. It is to be understood that while the data abstractions 210, 240, 270 may be illustrated and described in terms of their respective graphical representations, reference to the data underlying the graphical representations is implied. A description herein of an action on graphical representations impliedly refers to a suitable and corresponding machine-implemented action on the underlying data. It is to be understood also that data abstractions may be rendered in memory, such as by image data, without being presented graphically to the designer. Further, the underlying circuit data 200 may include data items that are not presented to the designer in abstractions illustrated and described herein. For example, data abstractions other than those illustrated and described herein may be implemented with the present invention, and the underlying circuit data 200 would include data items for those abstractions. Additionally, it is to be understood that data items, such as pin numbers, component and part designations, signal names, etc., other than those illustrated herein may be displayed in any and all of the graphic representations of the data abstractions, but may be omitted from the drawings herein for purposes of clarity in the figures.

Referring first to the simple schematic data abstraction 210, it is to be noted that the circuit 200 includes several components: an inductor 212, capacitors 214, 218, and a transistor 216. The components 212, 214, 216, and 218 are interconnected through a plurality of connections, representatively illustrated at connection 222 forming a plurality of nets, representatively illustrated at net 224. A net, as used herein, is a description of a connection of pins, i.e., points of connection on a circuit component, between components in a design. For example, as is illustrated through simple schematic data abstraction 210, the net 224 connects the base of transistor 216, the anode of capacitor 214, and the source node 223, all of which are ultimately interconnected by conductor segments in a fabrication process of the physical circuit. In certain embodiments of the invention, the net 224 is stored in a data structure constructed in a memory device, such as that described further below. In addition to points of connections on circuit components, a pin may define a connection between conductor segments, in which case the connection will be referred to herein as a node, such as is illustrated at node 215. A pin may also define a connection between different layers of a design (not illustrated), in which case the connection will be referred to herein as a via.

The circuit 200 may form a sub-circuit of a broader electrical circuit such as an extended net. As used herein, an extended net, or, alternatively, an XNet, is a set of nets having member nets that are interconnected through a predetermined set of components. In certain embodiments of the present invention, a designer may include any number of components independently of component type into an XNet, even across multiple levels of a circuit design hierarchy. Accordingly, for purposes of description and without loss of generality, the circuit 200 will also be referred to hereinafter as the XNet 200. The XNet 200, for example, includes the nets that interconnect the inductor 212, the capacitors 214 and 218, and the transistor 216. An XNet may be defined in accordance with a wide range of selection criteria, such as convenient size, an input/output relationship of signals processed thereby, common properties of components, and others. For example, an RF XNet includes any net that interconnects components that are designed to operate in accordance with requirements of an RF operational domain. An RF XNet may be further defined by other criteria, such as by the input/output relationship of the input and output nets of the sub-circuit.

The simple schematic data abstraction 210 includes a graphic symbol of each component 212, 214, 216, and 218 as well as a graphic representation of the connections between the components. The connections 220, 222, as presented in the simple schematic data abstraction 210, reveal only what components are connected, and at which pins, without specific physical circuit realization details, such as to how the connections are routed between structures in the circuit design and the dimensions of components and connections when fabricated in a physical circuit. The components and connections in the simple schematic data abstraction 210 may be arranged to reveal pertinent information regarding characteristics and/or behaviors of the circuit 200, which may otherwise be obscured in an arrangement of the physical components and connections as fabricated in a physical medium. For example, the skilled artisan will readily recognize from the simple schematic data abstraction 210 that the circuit 200 is a Collpitts oscillator circuit, where such identification is not readily forthcoming from the layout data abstraction 270 of the same circuit 200.

In certain EDA design flows, which may be implemented in conjunction with the present invention, the data entered by way of a schematic entry interface to produce the simple schematic data abstraction 210 undergoes automatic machine operations, as well as manual user operations, collectively illustrated at flow arrow 225, to generate a physical layout of the circuit 200. Operations 225 may include, among others, creating a netlist, component placement, autorouting, and manual routing of connections. The present invention, and more particularly, the processes 225 used therewith, is not limited to any particular technique or process by which a physical layout of the circuit 200 is created from a simple schematic data abstraction 210 thereof. It is to be understood, however, that the simple schematic data abstraction 200 need not be physically generated as part of the design process to practice the present invention. The electrical circuit 200 may simply reside as the concept 110 in the mind of the designer 115 and may be entered into the design data by way of the logical data abstraction 240 or the layout data abstraction 270, such as by the exemplary processes described below.

The exemplary layout data abstraction 270 includes, among other things, the geometric shapes, physical dimensions, and the relative placement of the physical structures by which the circuit 200 is fabricated in a physical medium. For example, the physical structure of the inductor 212 is represented in the layout data abstraction 270 as inductor pattern 212', the capacitors 214 and 218 are represented in the layout data abstraction 270 as capacitor patterns 214' and 218', respectively, and transistor 216 is represented in the layout data abstraction 270 as transistor symbol 216'. It is to be noted that, as is depicted by the graphical representation of the layout data abstraction 270, the inductor 212 and the capacitors 214, 218 are fabricated from conductive patterns formed on the physical medium according to the patterns 212', 214', and 218', respectively, as opposed to being implemented by distinct packaged components. The layout data abstraction 270 presents, further, data defining the structures forming the connections 220 and 224 at connections 220' and 224', respectively. The connections 220' and 224' may be ultimately constructed, and represented as, for example, transmission line (TL) segments, representatively illustrated at TL segment 274. It is to be understood that the structures forming the circuit 200 may be constructed from multiple layers of material, and only certain layers may be presented to a user in a view of layout data abstraction 270 at any one time. The present invention is not limited to any particular presentation technique by which different physical layers are presented to a user.

As used herein, any design operation following the operations 225, i.e., a design operation performed at or subsequent to the components and connections being geometrically established in the layout, is referred to as a back-end process, where, conversely, any operation performed prior to such geometric establishment is referred to herein as a front-end process. The physical layout produced by operations 225 may be viewed and modified via the layout data abstraction 270 through a user interface of an EDA system. Typical back-end processes include design verification processes, such as one or more design rule check (DRC) processes that, for example, determine whether any specified design tolerances are violated in the layout of the circuit 200. Additionally, traditional back-end processes may include a layout-versus-schematic (LVS) process that, for example, determines whether the layout data abstraction 270 is logically and functionally equivalent to the simple schematic data abstraction 210.

In accordance with the present invention, the logical data abstraction 240 may be captured in a schematic entry process and/or derived from either the simple schematic data abstraction 210 or the layout data abstraction 270. The logical data abstraction 240 includes data items pertaining to the structure of the XNet 200, but in a manner by which the data may be presented in logical schematic form. For example, the logical data abstraction 240 includes data defining TL segments, such as illustrated by the representation of the TL segment 244, and data defining the circuit components, such as illustrated by the inductor representations 212", capacitor representations 214", 218", and transistor representation 216". The designer may manipulate the data underlying the respective representations presented in the logical data abstraction 240 to define the circuit behavior of the respective components 212, 214, 216, and 218, through representations 212", 214", 216", and 218", respectively. Additionally, the designer may define the circuit behavior of the TL segments 220' and 224' through representations 220" and 224". Such behavior definition, as well as the modification thereof, may be achieved through user interaction with a user interface, such as that described below, and/or by automated machine operations, such as those described below, or a combination of both.

As stated above, the logical data abstraction 240 may be derived from the simple schematic data abstraction 210 through one or more processes 230, or from the layout data abstraction 270 through one or more processes 260. For example, processes 230 may include a process that converts one-dimensional connection data, i.e., data that defines only a connection between pins, to multi-dimensional data that defines structure, such as the representations of TL segments 244. Beneficially, in accordance with certain embodiments of the present invention, with the TL segments 244 defined in the logical data abstraction 240, various verification processes, such as certain DRC processes may be performed as front-end processes. For example, a DRC process may determine whether the component data of connected components, such as the components 242, prescribe a structure, such as a contiguous transmission line structure, that is consistent with design requirements of the operational domain, such as to minimize RF signal reflections at the interface of abutting components. Thus, a designer may design and verify a greater number of system behaviors without reliance on the layout data abstraction 270. Additionally, certain errors identified by the front-end verification processes can be corrected in a schematic entry interface, which is generally more efficient for a designer. One or more processes 265 may be used with the present invention to generate the layout data abstraction 270 from the logical data abstraction 240, such as, among others, component placement, component pattern generation, such as the inductor pattern 212', autorouting, and manual routing of connections.

Processes 260 may include topological extraction of component data, back-annotation of the component data, and arrangement of components into a topology other than the topology of the layout data abstraction 270. The relative placement of symbolic data of the logical data abstraction 240 is referred to herein as a logical topology, represented as logical topology 241, and spatial data of the layout data abstraction 270 is referred to herein as a physical topology, represented as physical topology 271. In certain embodiments of the present invention, the topologies 270 and 271 are mutually independent, allowing the logical data abstraction 240 to be arranged in a topology other than that of the layout data abstraction 270.

The mechanisms described with reference to FIG. 2A combine in what is referred to herein as a concurrent logical and physical design flow, whereby a logical data abstraction 240 may be created that maintains both logical and physical data. The logical and physical data can be entered as a front-end process, or may be extracted from either a previously designed schematic or circuit layout data. In certain embodiments of the present invention, concurrent logical and physical design flow furnishes the designer with the capability to create and structurally verify sub-circuits in a manner by which the design of the electrical circuit can proceed incrementally.

Illustrated in FIG. 2B is conceptual diagram of an exemplary circuit design 280 of an electrical circuit. The exemplary circuit design 280 includes all of the design data of the electrical circuit, representatively illustrated as circuit data 282, 287, and 288. Additionally, the circuit design 280 may include a plurality of drawing sheets 283, 289, and 290. A drawing sheet, as used herein, is a data structure that contains the circuit data of one or more sub-circuits in a manner that facilitates insertion of the circuit data into a circuit design. It is to understood, that a data structure, as used herein, refers to one or more data items that is stored in, and restored from, a data storage device.

Drawing sheet 290 illustrates exemplary content that can be utilized in embodiments of the present invention. Exemplary drawing sheet 290 includes data structures 292 and 294 containing data describing corresponding XNets. As used herein, descriptive data is a set of quantifiable attributes or parameters by which an object is represented to a machine, such as a data processing apparatus, in a manner sufficient to satisfy one or more predetermined objectives. For example, dimensions of structures, symbols representative of structures, and coordinates defining relative placement of structures, among others, are data describing an XNet.

Each of the XNet data structures 292 and 294 may include logical data 295, by which the logical data abstraction 240 of the corresponding XNet may be formed, and physical data 297, by which a physical data abstraction 270 of the corresponding XNet may be formed. In certain embodiments of the invention, the logical data 295 includes logical topology data 241 to define a relative placement of symbolic representations of electrical structures in the logical data abstraction, and the physical data 297 includes physical topology data 271 to define the placement of the electrical structures in the physical data abstraction, which corresponds to the placement of the electrical structures in a physical medium once the XNet is fabricated.

In certain embodiments of the present invention, the XNet data structures 292 and 294 include one or more addresses, representatively illustrated at address 296, by which the XNet is linked to other portions of the circuit design 280. For example, the data in XNet data structure 294 can be incorporated in circuit data 287 at incorporation point 285, as indicated by the incorporation process arrow 289, by providing the address of address data field 296 in the address data field 284, and vice versa, and providing the address of address data field 298 in the address data field 286, and vice versa. Thus, when incorporation point 285 is accessed by way of a machine-implemented process, the data in data structure 294 will be provided to the machine-implemented process.

The drawing sheet 290 may include a sheet address field 299 by which the drawing sheet 290 may be inserted at a specific location among the drawing sheets 283 and 289. Drawing sheet ordering is a feature that allows the designer to organize the circuit data 280 according to the designer's preference.

It is to be understood that the data content of a drawing sheet 290 can vary in accordance with the application of the present invention. In the examples that follow, the drawing sheet 290 will be constructed to store data of one or more RF XNets, and will be referred to herein as an RF sheet.

Figure 3A:
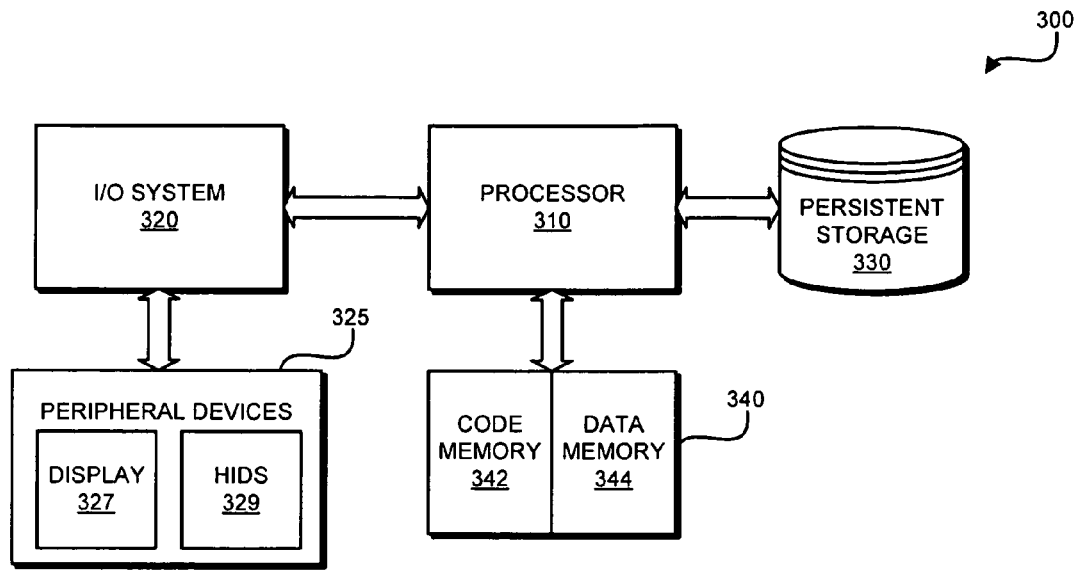
FIGS. 3A-3B are schematic block diagrams of exemplary system configurations suitable to practice the present general inventive concept.

FIG. 3A illustrates an exemplary machine configuration suitable to practice the present invention. An exemplary data processing apparatus 300 of FIG. 3A includes an input/output (I/O) system 320, through which the data processing apparatus 300 may communicate with peripheral devices, collectively represented at block 325, and/or with external network devices (not illustrated). Among the peripheral devices 325 may be a display device 327, on which data are displayed as image data, and one or more Human Interface Devices (HIDs) 329, such as a keyboard, a mouse, a track ball, a stylus, a touch screen, a touchpad, and/or other devices suitable to provide input to the data processing apparatus 300.

The exemplary data processing apparatus 300 of the embodiment illustrated in FIG. 3A includes a processor 310 to, among other things, execute processing instructions that implement various functional modules, such as those described below with reference to FIG. 3B. It is to be understood that the present invention is not limited to a particular hardware configuration or instruction set architecture of the processor 310, which may be configured by numerous structures that perform equivalently to those illustrated and described herein. Moreover, it is to be understood that while the processor 310 is illustrated as a single component, certain embodiments of the invention may include distributed processing implementations through multiple processing elements. The present invention is intended to embrace all such alternative implementations, and others that will be apparent to the skilled artisan upon review of this disclosure.

A storage unit 340 may be utilized to store data and processing instructions on behalf of the exemplary data processing apparatus 310 of FIG. 3A. The storage unit 340 may include multiple segments, such as a code memory 342 to maintain processor instructions to be executed by the processor 310, and data memory 344 to store data, such as data structures on which the processor 310 performs data manipulation operations. The storage unit 340 may include memory that is distributed across components, to include, among others, a cache memory and a pipeline memory.

The data processing apparatus 300 may include a persistent storage system 330 to store data and processing instructions across processing sessions. The persistent storage system 330 may be implemented in a single persistent memory device, such as a hard disk drive, or may be implemented in multiple persistent memory devices, which may be interconnected by a communication network.

Figure 3B:
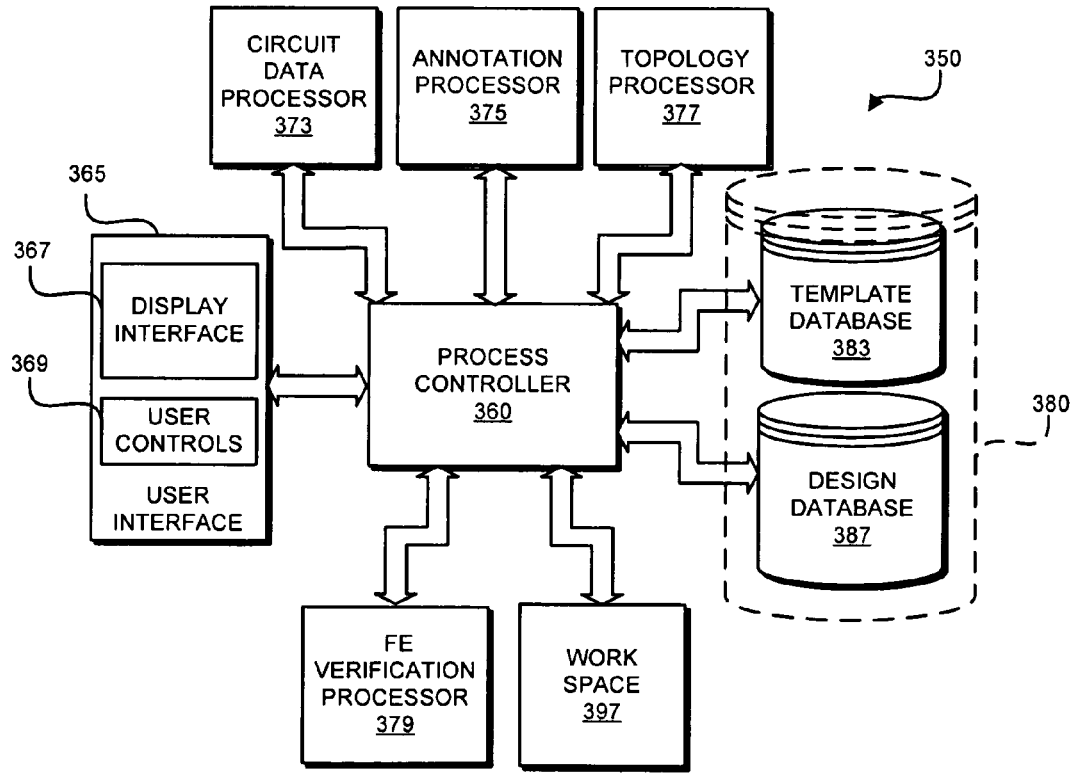

FIG. 3B illustrates an exemplary configuration of functional modules suitable to practice certain embodiments of the present invention. The exemplary system illustrated in FIG. 3B may be implemented through processing instructions executed on the processor 310, and in cooperation with other components as illustrated in FIG. 3A, form an exemplary circuit design system (CDS) 350 on the exemplary data processing apparatus 300. The exemplary CDS 350 may be operated by a circuit designer to design and analyze circuit designs and to provide circuit realization data upon affirmation that the circuit design is compliant with predefined design rules. The design system 120 of FIG. 1 may be implemented by the exemplary CDS 350.

It is to be understood that the number and respective assignment of functions to the functional modules illustrated in FIG. 3B has been chosen as a matter of convenience for facilitating a complete description of the exemplary embodiment illustrated therein. Additionally, certain embodiments of CDS 350 will include functional modules other than those illustrated, but such additional functional modules have been omitted in the interest of conciseness. The skilled artisan will recognize numerous other configurations and functional groupings to carry out the present invention. The scope of the present invention is intended to embrace all such alternative configurations.

The exemplary CDS 350 includes a process controller 360 to coordinate and control the interoperations of the functional modules of the CDS 350 so as to achieve a fully operational data processing system. For example, the process controller 360 may receive data corresponding to user manipulations of the user interface 365 (to be described below), may format the data into a command and/or data location in memory, and may convey such information to the applicable functional module of the CDS 350. The process controller 360 may subsequently receive processed data from the applicable functional module and forward the data to another functional module, as well as to indicate such processing on the user interface 365. The process controller 360 will perform other coordination and control operations according to the implementation of the CDS 350, and such other operations, as well as the implementation thereof, can be embodied by a wide range of well-known process control methods and apparatuses. The present invention is intended to encompass all such alternatives of the process controller 360, including multi-threaded and distributed process control methodologies.

As indicated above, the CDS 350 may include a user interface 365 through which a user interacts with the CDS 350. The user interface 365 may be implemented by a combination of hardware devices and suitably programmed processing instructions executed by the processor 310. The user interface 365 may be used to present data to the user in a meaningful form on a display interface 367, such as through graphical representations of circuit schematics, circuit layout diagrams, circuit test bench interfaces, and of data management interfaces such as file directories, circuit hierarchy diagrams, and other images recognized by the user. The user interface 365 may interpret user manipulations of any HIDs thereof into signals, messages and instructions that can be recognized by the process controller 360. The user interface 365 may include a plurality of user controls 369 to afford the user interactivity with and control over the CDS 350. The user controls 369 may include the HIDs described above, and may also include software implemented controls on the display interface 367, such as toolbars and/or buttons, menus of commands, text command entry blocks, and other suitable software controls. The foregoing description of the user interface 365 may be met by a suitably configured graphical user interface (GUI), the implementation details of such will be omitted in the interest of conciseness.

The CDS 350 may include a design database 387 of circuit objects that maintain all the data necessary to design, analyze, modify, and fabricate an electric circuit per the specifications of a circuit designer. As used herein, a circuit object is a data structure that can be stored in a memory device to contain data of a circuit element so that the circuit element can be viewed, modified, logically connected with other circuit elements, and analyzed in one or more circuit design contexts selected by a user. A circuit object may also contain graphical abstraction information so that a particular circuit element may be presented on the display interface 367 as, for example, a schematic symbol in a schematic entry design context, presented as a footprint in a layout design context, presented as a routing component in a circuit routing design context, and provided as a component model in a circuit analysis and design verification context. A circuit object may also be hierarchical, whereby a circuit object contains other circuit objects of circuit elements interconnected to form a component that has a schematic symbol, layout footprint, and a terminal characteristics model used as a single element in a circuit. An example of such a circuit object is that of an operational amplifier.

Figure 4A:
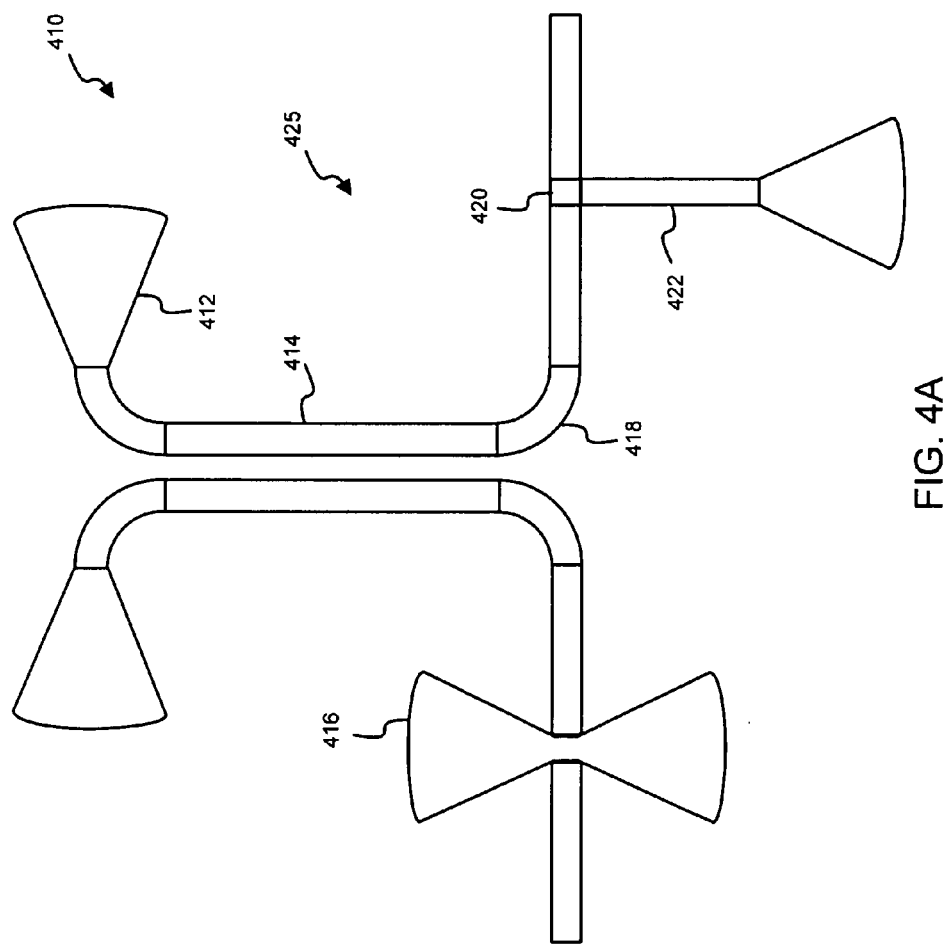
FIG. 4A is a diagram of a layout data abstraction of an extended net in accordance with an embodiment of the present general inventive concept.

FIG. 4A illustrates a graphical representation of a circuit object of an exemplary RF XNet 410 as depicted through the layout data abstraction thereof. The layout data abstraction of the RF XNet 410, as may be displayed on display interface 367, depicts the geometric shapes, such as butterfly stub 416, microstrip curves, representatively illustrated at microstrip curve 418, radial stubs, representatively illustrated at radial stub 412, microstrip lines, representatively illustrated at microstrip line 422, coupled lines 414, and microstrip tee junction 420, in a spatial arrangement corresponding to that of the circuit as realized in a physical medium by a fabrication process. Each of the structures in the RF XNet 410, collectively referred to as electrical structures 425, have parameters assigned to data fields that define the construction of the respective structures.

FIG. 4B illustrates an exemplary data structure 430 by which the physical topology of the RF XNet 410 may be stored in, for example, the design database 387. In the example of FIG. 4B, the data structure 430 is in the form of a text file and, as such, will be referred to herein as a topology file 430. It is to be understood that other data formats for storing the physical circuit topology may be used with the present invention without deviating from the spirit and intended scope thereof. Topology file 430 may include data structures that define different aspects of the physical topology. For example, the topology file 430 may include data structures that define, among other things, which electrical structures 425 are included in the RF XNet 410, the physical dimensions of the electrical structures 425, the locations in a physical medium of the electrical structures 425, and how the electrical structures 425 are connected one with another.

As illustrated in FIG. 4B, the exemplary topology file 430 includes a header 435 in which general information regarding the overall topology may be stored, such as, for example, a name 436. The exemplary topology file 430 includes a separate component data structure 440 for each electrical structure in the RF XNet 410. The illustrated component data structure 440 corresponds to the butterfly stub 416 in FIG. 4A, and similar data structures may be constructed for the other components in the RF XNet 410.

The exemplary component data structure 440 includes a component designator 441, a canonical path reference 442 in the circuit design to a location in a logical hierarchy of the circuit design at which the component is assigned, a rotation angle 443 of the component, a physical coordinate location 444 of the electrical structure, and data field 445 establishing whether the component is flipped in mirror fashion. It is to be understood that other data regarding a particular electrical structure may be stored in component data structure 440 to sufficiently store a physical state of the corresponding component.

The component data structure 440 may include a parameter data structure 450 containing data fields that define the shape of the electrical structure. The number and types of data fields will depend on the type of electrical structure being defined. The exemplary data fields illustrated in FIG. 4B are particular to the microstrip butterfly stub 416, and define the geometric shapes that will form the microstrip butterfly stub 416 in the physical medium. Additionally, the parameter data structure may contain other data, such as a data field 455 identifying whether the component is an RF component. In certain embodiments of the present invention, a designer may set data field 455 to facilitate an RF XNet extraction process, to be exemplified below, so that a corresponding electrical device is included in an RF XNet.

The exemplary component data structure 440 includes a connections data structure 460 that identifies the nets to which the pins of the component are connected. The number of data fields defining the pin connections corresponds to the number of pins on the component. The butterfly stub 416 has two ports, and therefore only two pins, and only two data fields 462 assigning the net connections to the component ports. On the other hand, the coupled line component 414 of FIG. 4A has four ports, and a connections data structure for the coupled line component 414 may include four data fields to which the appropriate net connections would be assigned.

Design database 387 may store drawing sheets that may be inserted into the circuit design, as described above with reference to FIG. 2B. The drawing sheets may be stored in the design database 387 according to a sheet storage scheme established through the sheet address 299 described above. Such a storage scheme may be presented on the user interface 365 via a suitable graphical representation thereof, whereby the designer can navigate the pages of the circuit design 280.

The exemplary CDS 350 includes a template database 383 in which to store schematic topology templates. As used herein, a schematic topology template is a data structure to store data defining a spatial arrangement of logically connected schematic symbols of the logical data abstraction. By such templates, the logical topology of the schematic diagram may be other than the physical topology of the layout of the circuit, which can beneficially provide greater readability of the circuit data and convey greater meaning to the designer.

Figure 5A:
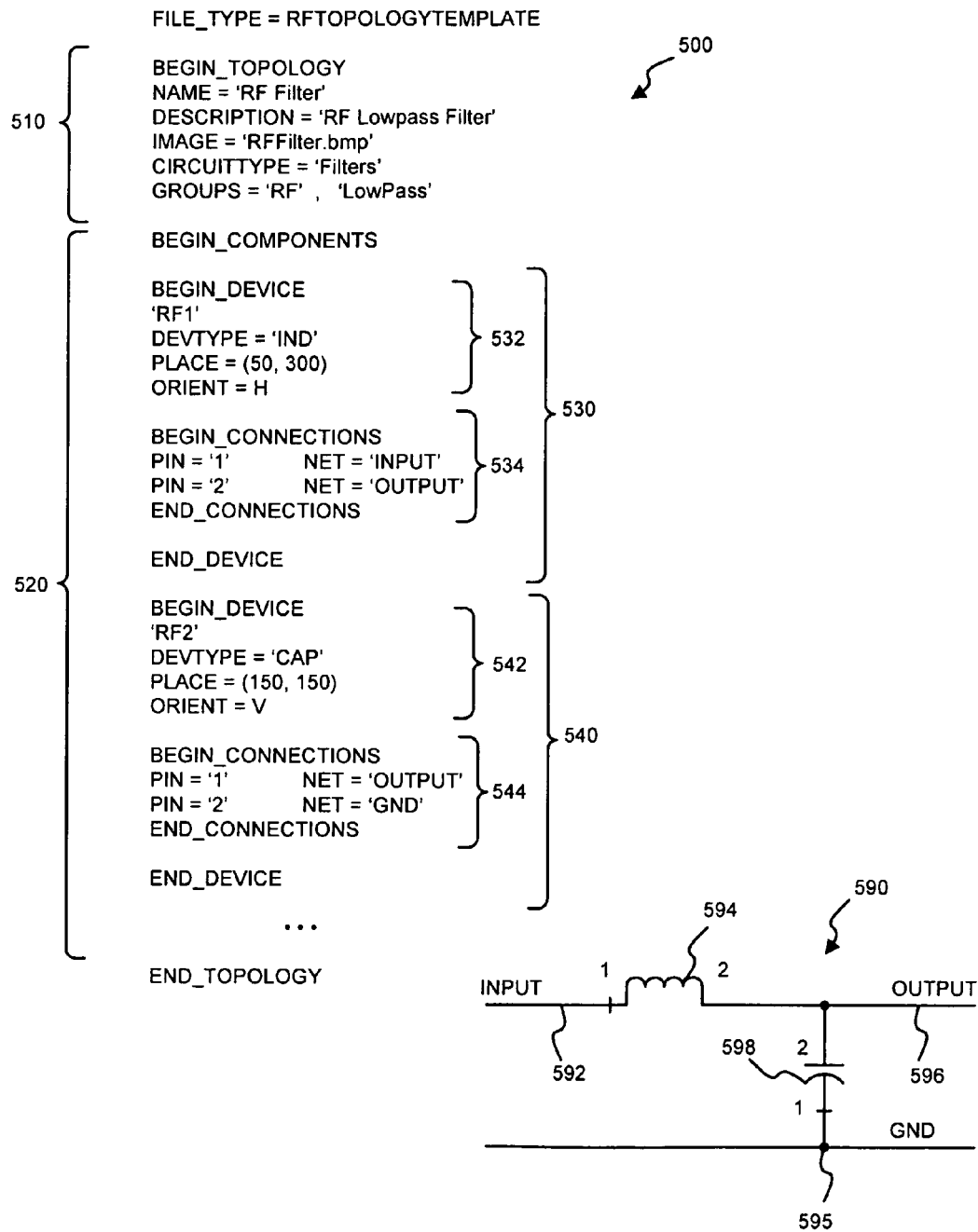
FIG. 5A is an exemplary data structure of a schematic topology template in accordance with an embodiment of the present general inventive concept.
Figure 5B:
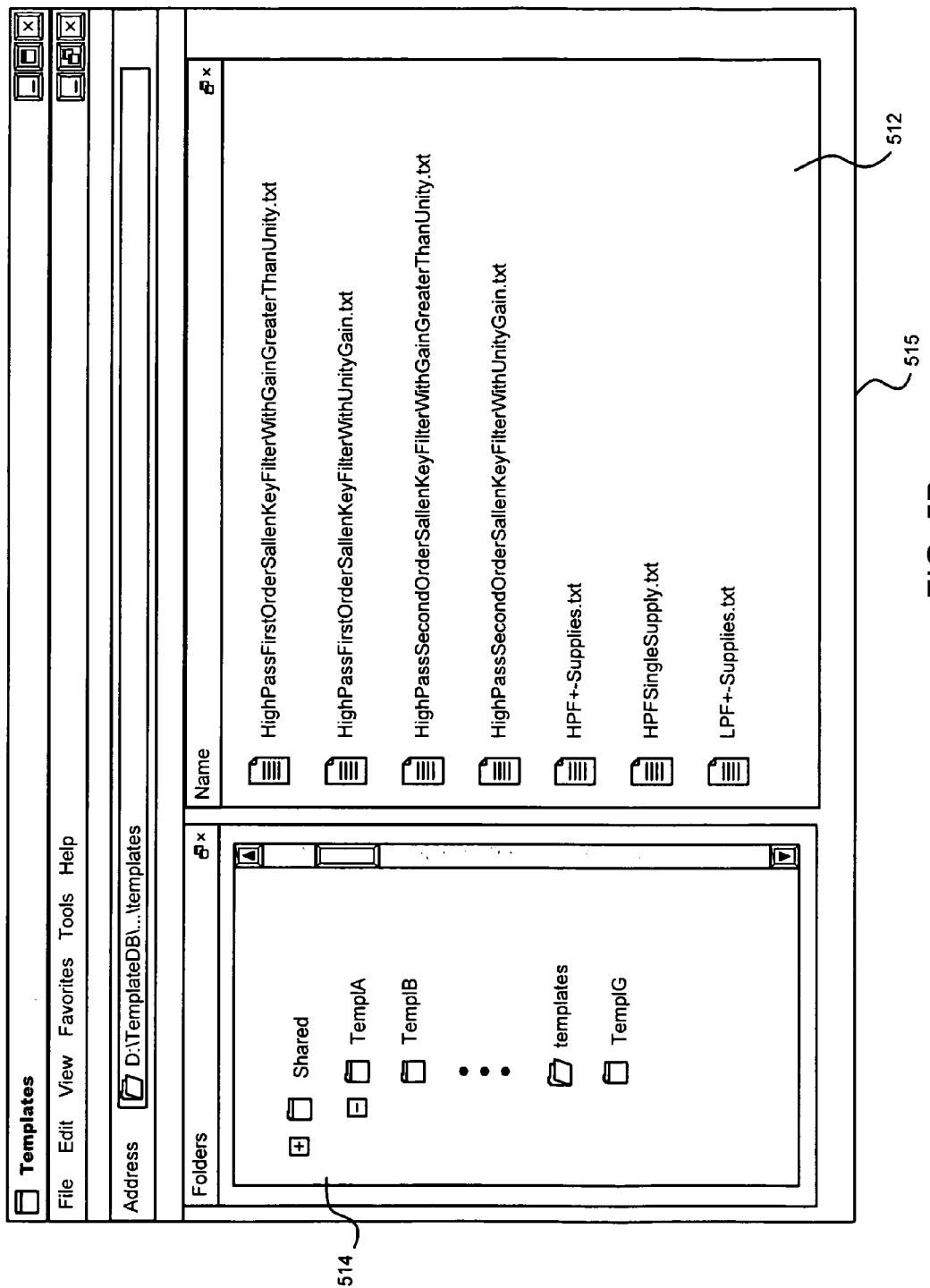
FIG. 5B is an illustration of an exemplary user control by which a designer may select an appropriate schematic topology template in accordance with an embodiment of the present invention.

FIG. 5A illustrates an exemplary schematic topology template 500, which defines the schematic topology 590. Although the schematic topology template 500 is illustrated in the form of a text file, it is to be understood that other data structure formats for the schematic topology template 500 may be used with the present invention without departing from the intended scope thereof. The exemplary schematic topology template 500 includes a general information section 510, which may contain data by which the template may be located in the template database 383. For example, the general data of all templates in the template database 383 may be compiled and a list may be populated and presented to the designer through a suitable user control, such as menu control 515 of FIG. 5B, displayed on user interface 367. The template database 383 may contain multiple sets of templates, as illustrated in navigation pane 514 of FIG. 5B, each of which may contain a plurality of templates, as illustrated in pane 512 of FIG. 5B. Each of the schematic topology templates 500 may be stored in the template database 383 such that a user-identifiable characteristic of the template is conveyed to the designer. In the embodiment illustrated in FIG. 5B, the templates are stored under a file name that readily identifies the characteristic, in this case the name of the type of filter the topology of which is to be applied a schematic of a particular XNet. An exemplary application of a circuit topology template to an XNet schematic is described further below.

The exemplary schematic topology template 500 includes a data structure 520 that contains one or more device definitions 530 to respectively define the types of components and the placement and orientation of the components in the schematic topology. For example, data structure 530 describes the inductor 594 of the schematic topology 590, and data structure 540 describes the capacitor 598 of the schematic topology 590. Exemplary data structure 532 defines the relative placement and orientation of the inductor 594 and data structure 534 defines the connections of the inductor 594. As is illustrated in FIG. 5A, the inductor 594 is oriented horizontally, pin 1 of the inductor 594 is connected to the net connection INPUT, and pin 2 of the inductor 594 is connected to the net connection OUTPUT. Similarly, exemplary data structure 542 defines the relative placement and orientation of the capacitor 598 and data structure 544 defines the connections of the capacitor 598. As is illustrated in FIG. 5A, the capacitor 598 is oriented vertically, pin 1 of the capacitor 598 is connected to the net connection GND, and pin 2 of the capacitor 598 is connected to the net connection OUTPUT.

Figure 5C:
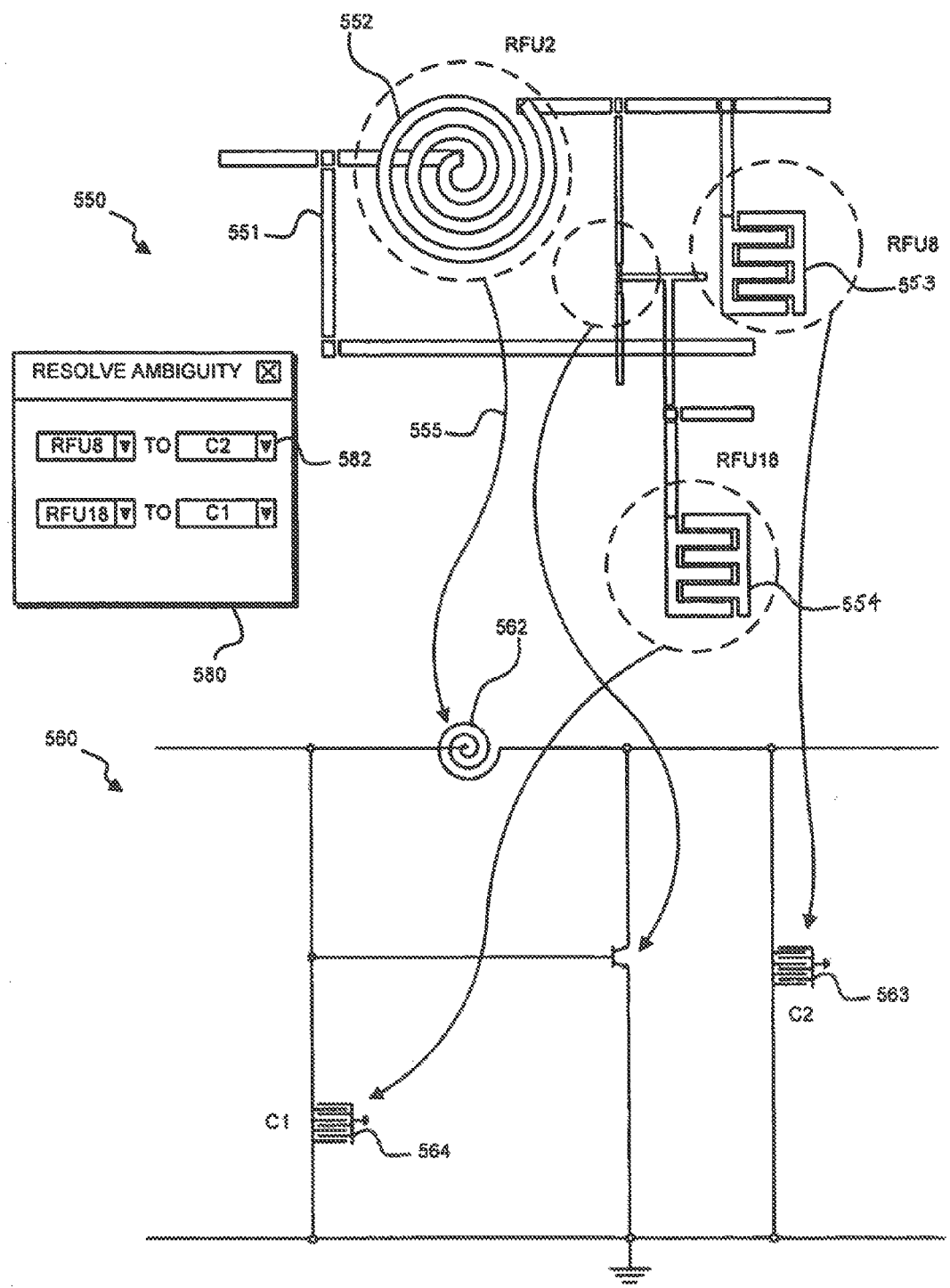
FIGS. 5C-5D are diagrams illustrating an exemplary circuit topology template application in accordance with an embodiment of the present general inventive concept.
Figure 5D:
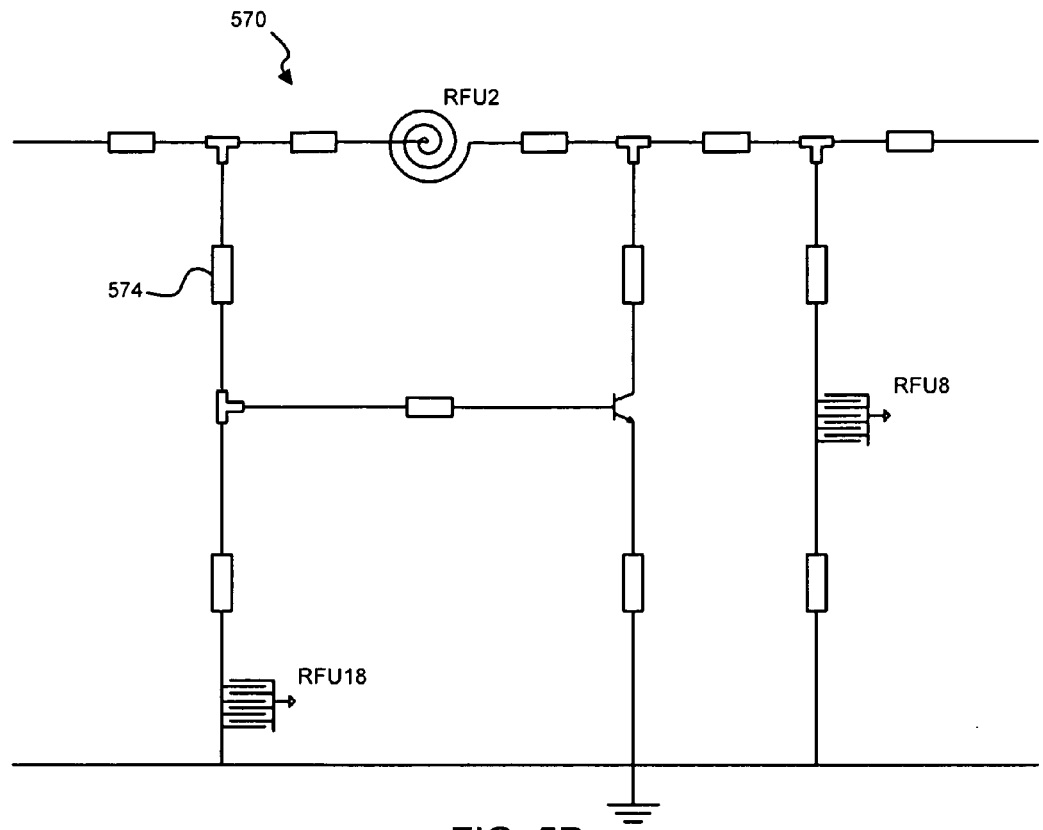

The device definitions 530 and 540 are correlated with corresponding circuit components of the XNet to which the template is being applied, as is described with reference to FIGS. 5C-5D. As is illustrated in FIG. 5C, components of an XNet 550, representatively illustrated at inductor 552, capacitors 553 and 554 are mapped to corresponding devices, representatively illustrated at inductor symbol 562, and capacitor symbols 563 and 564 in the schematic topology template 560 by way of a correlation process, illustrated by the flow arrows representatively illustrated at flow arrow 555. Once the correlation between the components of XNet 550 and the devices of schematic topology template 560 has been established, the RF structures of the XNet 550 residing between the devices of the schematic topology template 560, representatively illustrated at TL segment 551, can be mapped to the corresponding location in the schematic topology of the logical data abstraction 570, as shown at TL segment symbol 574 of FIG. 5D. However, the schematic topology template 560 defines logical locations for two capacitors 563 and 564, and the RF XNet 550 defines structure for two capacitors 561 and 562. Thus, the ambiguity of the mapping of capacitors 561 and 562 to template capacitors 563 and 564 must be resolved. In certain embodiments of the present invention, a user control is presented to the user, such as on the user interface 365. In the exemplary user control 580 illustrated in FIG. 5C, drop-down controls, representatively illustrated at drop-down control 582, are activated by the user to map ambiguous components of the physical topology to the correct location in the logical topology. It is to be understood that suitable ambiguity resolution controls other than the control 580 may be used with the present invention without deviating from the spirit and intended scope thereof.

Figure 5E:
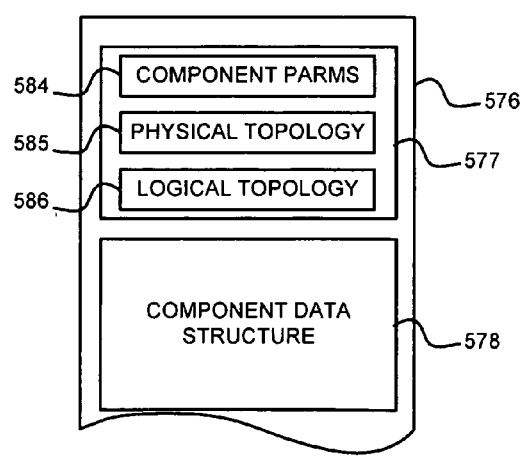
FIG. 5E is a diagram of an exemplary XNet data structure in which to store data defining an XNet in accordance with an embodiment of the present general inventive concept.

In certain embodiments of the present invention, an XNet data structure 576 is formed to contain the component data of components that are members of the XNet, as illustrated in FIG. 5E. In the exemplary XNet data structure, each component of the XNet is described by a component data structure 576 and 577. It is to be understood that while the diagram of the exemplary XNet data structure 576 depicts only two component data structures 577 and 578, additional component data structures may be included in the XNet data structure to encompass all of the member components of the XNet.

As illustrated in FIG. 5E, each component data structure 577, 578 includes component information in a component parameter data structure 584, a physical topology data structure 585, and a logical topology data structure 586. The component parameter data structure 584 includes the physical structure data defining the shape, dimensions, orientation, etc., of the corresponding member component. The component parameter data structure may implemented by the exemplary component designator 441, the exemplary canonical path reference 442, the mirror data field, and the exemplary parameter data structure 450 illustrated in FIG. 4B. The physical topology data structure 585 may include the exemplary rotation angle 443 and the exemplary physical coordinate location 444 illustrated in FIG. 4B. The logical topology data structure may include the PLACE data and the ORIENT data of exemplary placement data structure 532 from the topology template 500 illustrated in FIG. 5A. Thus, once the mapping of the components in the layout data abstraction to the components of the topology template, the logical location data will be stored in the correct component data structure 577, 578 in the XNet data structure 576. The XNet data structure 576 may be stored as a circuit object in the design database 387, and may be reused in other electrical circuit designs.

It is to be understood that the design database 387 may interoperate closely with the template database 383, such as when circuit objects are shared therebetween. As such, the template database 383 and design database 387 may be considered, and indeed constructed, as a single database 380. The present invention is not limited to the manner in which the database 380 is constructed, and numerous possibilities of storing circuit data objects and related template objects can be used with the present invention without departing from the spirit and intended scope thereof.

The exemplary CDS 350 includes a circuit data processor 373 to perform general processing tasks on circuit objects, such as, among others, electrical structures, circuit components, XNets, and drawing sheets. Such processing tasks may include, among others, formatting circuit objects as entered by a user, generating data abstractions from circuit objects, modifying underlying circuit data in accordance with changes to a particular data abstraction, and rendering graphical representations of data abstractions for display. Additionally, the circuit data processor 373 may extract XNets from the circuit data, either from a layout or a schematic. The extracted XNets may be, among other things, incorporated into a drawing sheet, stored, modified, and reused as needed, even across different circuit designs.

Figure 6:
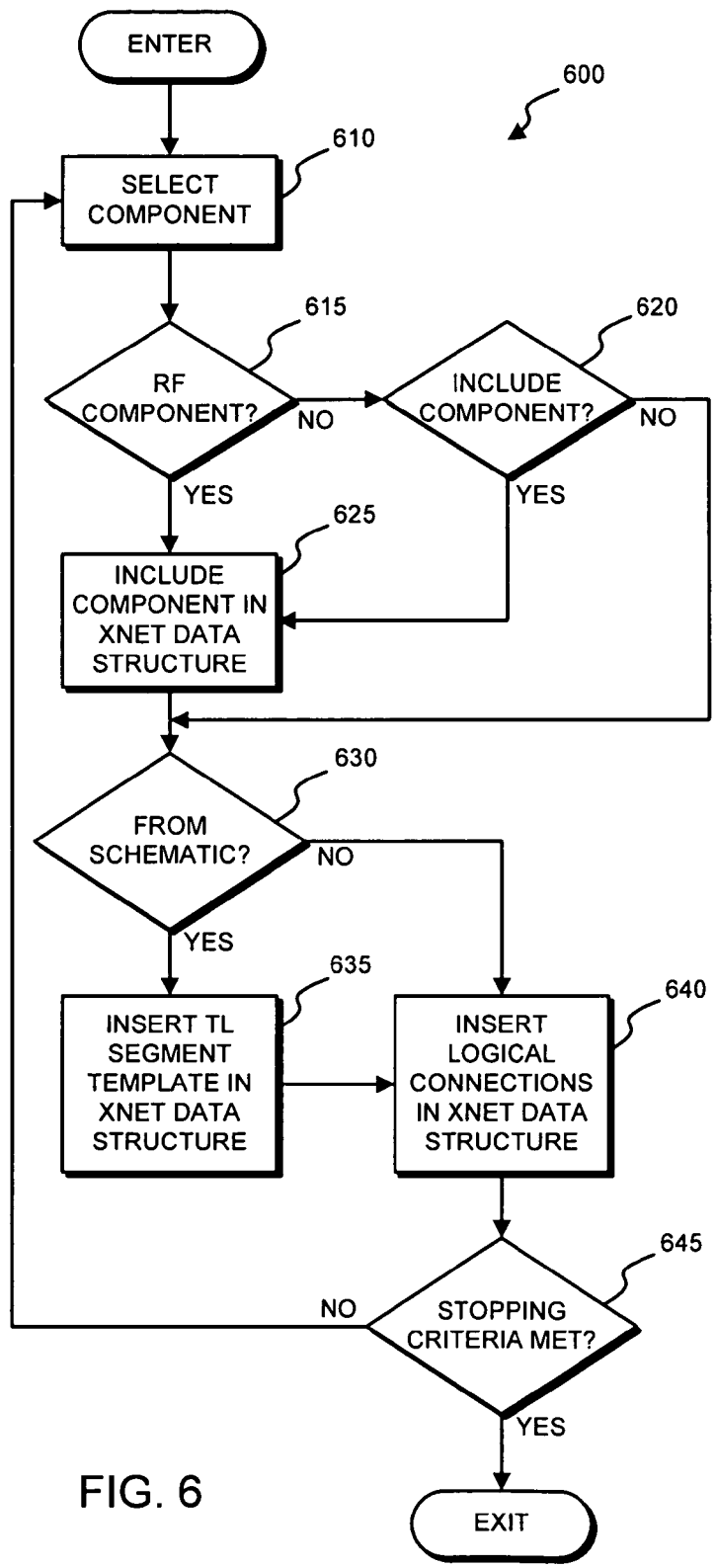
FIG. 6 is a flow diagram of an exemplary extended net import process in accordance with an embodiment of the present general inventive concept.

FIG. 6 illustrates an exemplary XNet extraction process 600 by which an RF XNet may be extracted. In operation 610, a component is selected from the data abstraction, be that a layout data abstraction or a schematic data abstraction. A component at which to start the process 600 may be manually selected by the designer, or may be automatically selected from predetermined selection criteria, such as where a first component is located in the circuit design. For example, if an XNet is extracted around a particular interface signal in the design, the process 600 may begin at the first component connected to that interface signal.

In operation 615, it is determined whether the selected component is an RF component. Whether a component is considered an RF component may be established by predetermined settings in the CDS 350. In certain embodiments of the present invention, a mechanism to override the default selection of only components constructed from RF TL segments is provided so that, for example, active components and discrete encapsulated passive components may be included in an RF XNet. Such override mechanism is useful to include components constructed by alternative fabrication technologies. For example, in RF XNets described herein, the fabrication technology used to construct the electrical structures is that by which RF TL segments are produced, such as by a printed circuit process. Components not produced by the TL segment fabrication technology, such as integrated circuit fabrication processes used to form active components such as transistors, and discrete component encapsulation process used to construct discrete devices, such as surface mount inductors and capacitors, may be included in the XNet. Referring to FIG. 4B, a circuit object for a component may include a data field ISRFELEMENT which may be set by a designer so that any component encountered during the XNet extraction process 600 may be included in the XNet design data. Such a data field may be evaluated by, for example, operation 620 of FIG. 6 and, when set, the selected component, regardless of the construction of the component, may be included in the RF XNet. If the selected component is to be included in the RF XNet, either as a result of operation 615 or operation 620, the component is stored in a data structure, such as the topology file 430 described above, in operation 625.

Figure 7:
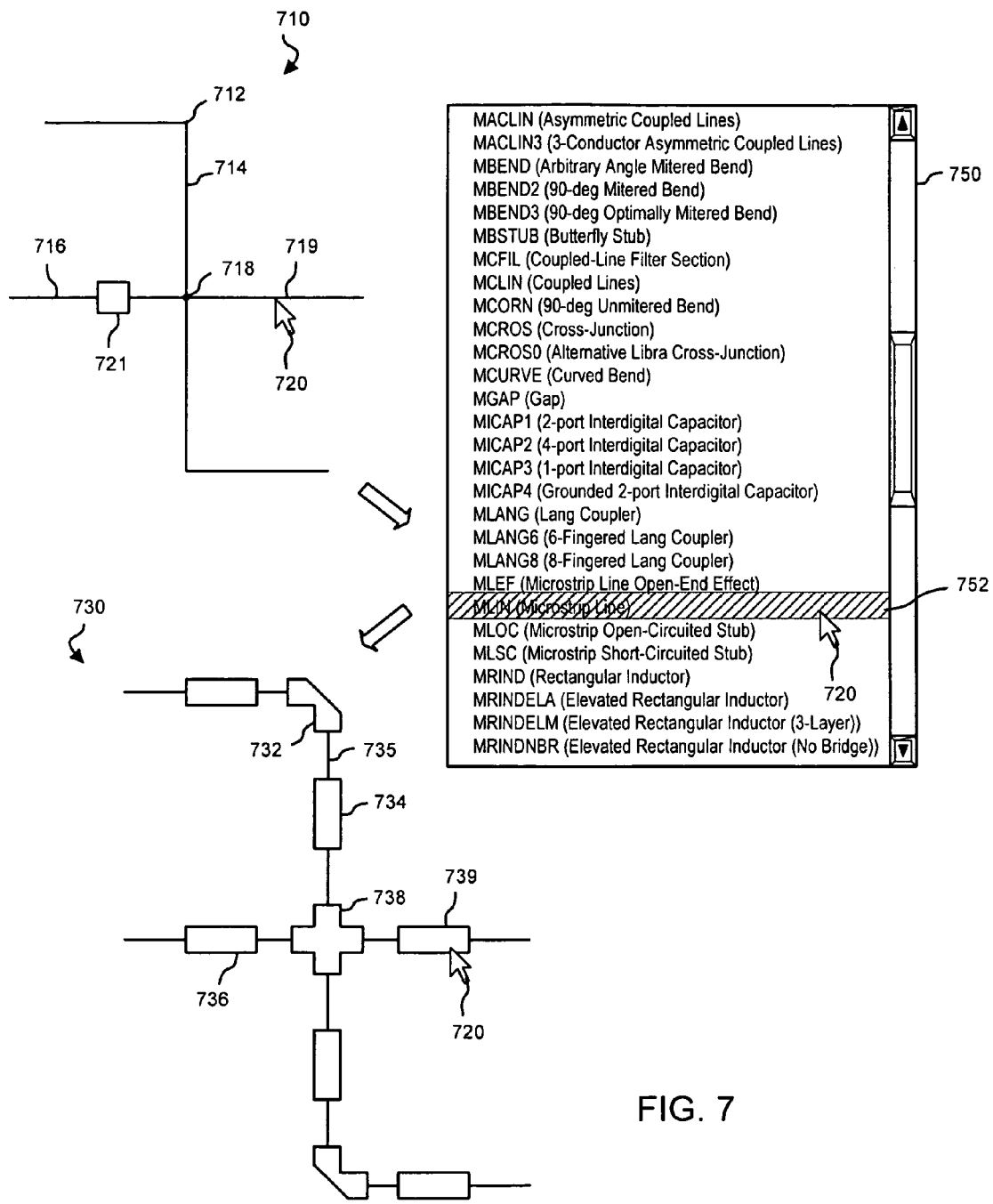
FIG. 7 is a diagram of an exemplary data conversion process in accordance with an embodiment of the present general inventive concept.

In operation 630, it is determined whether the RF XNet is being extracted from a schematic data abstraction. If so, a representation of a TL circuit object that serves to connect RF components is inserted into the RF XNet data structure. As is illustrated in FIG. 7, the circuit data processor 373 may be assigned preset instructions to convert straight connection sections of data abstraction 710, such as segments 714 and 716 to RF structures of a predetermined type in data abstraction 730, such as a microstrip line. A cross node, such as node 718 may be automatically converted into a microstrip cross-junction structure 738, and corners, such as corner 712 may be automatically converted into a microstrip bend, such as mitered bend 732.

In certain embodiments of the present invention, operation 630 may include schematic data entry in conjunction with the RF XNet extraction operation. For example, the designer may indicate a connection 719 between components (not illustrated), such as by a mouse operation, representatively illustrated at cursor 720. Upon the connection 719 being entered into the design, a placeholder symbol, such as the box 721, may be inserted in the connection, such as the connection 716. Subsequently, the designer may be presented with options by which the type of component may be selected. For example, upon the completed mouse operation 720 to indicate the connection 719, the placeholder symbol 721 is inserted in the connection 719 (not illustrated for purposes of clarity), and a menu control, such as menu control 750 may be presented to the user on the user interface 365. The menu control 750 may be activated by a mouse operation, illustrated at the cursor 720, from which the appropriate RF component may be selected such as at menu selection 752. The selected component 752 then replaces the placeholder symbol 721 in the logical data abstraction of the XNet, as illustrated at microstrip line 739. Similarly, the designer may select a symbol in data abstraction 730, such as by cursor 720, and then may select an alternative structure from menu 750. The parameters of a specifying the specific shape, dimensions, and cross-sectional structure, for example, of any instance of an electrical structure, such as TL segment 739 may be set by the designer once the TL segment has been inserted into the RF XNet.

As components are added to the RF XNet, including TL segments that are extracted from the layout or inserted in operation 635, the logical connections between components are inserted in operation 640. Such insertion is illustrated in FIG. 7, where the mitered bend 732 and the microstrip line 734 are joined by a connection line 735. Whereas, the connection is graphically illustrated as a line in FIG. 7, the RF XNet data structure may indicate the connection by a net designation by which components 732 and 734 are connected. Such connections may be achieved in the RF XNet data structure as described with reference to the connections data structure 460 in topology file 430 described above.

It is determined at exemplary operation 645 whether predetermined stopping criteria have been reached, such as whether the extent of the RF XNet satisfies a particular preference of the designer. If the stopping criteria have been met, the process exits. If, however, the stopping criteria have not been met, the process returns to operation 610, whereby a new component is selected. By way of the exemplary RF XNet extraction process 600, an RF XNet can be of arbitrary size and contain components that are other than RF shapes, such as the active components and discretely packaged passive components described above. The process 600 may be repeated to form other XNets from the same layout data, even to the extent that the entire circuit is partitioned into a plurality of XNets.

Figure 8A:
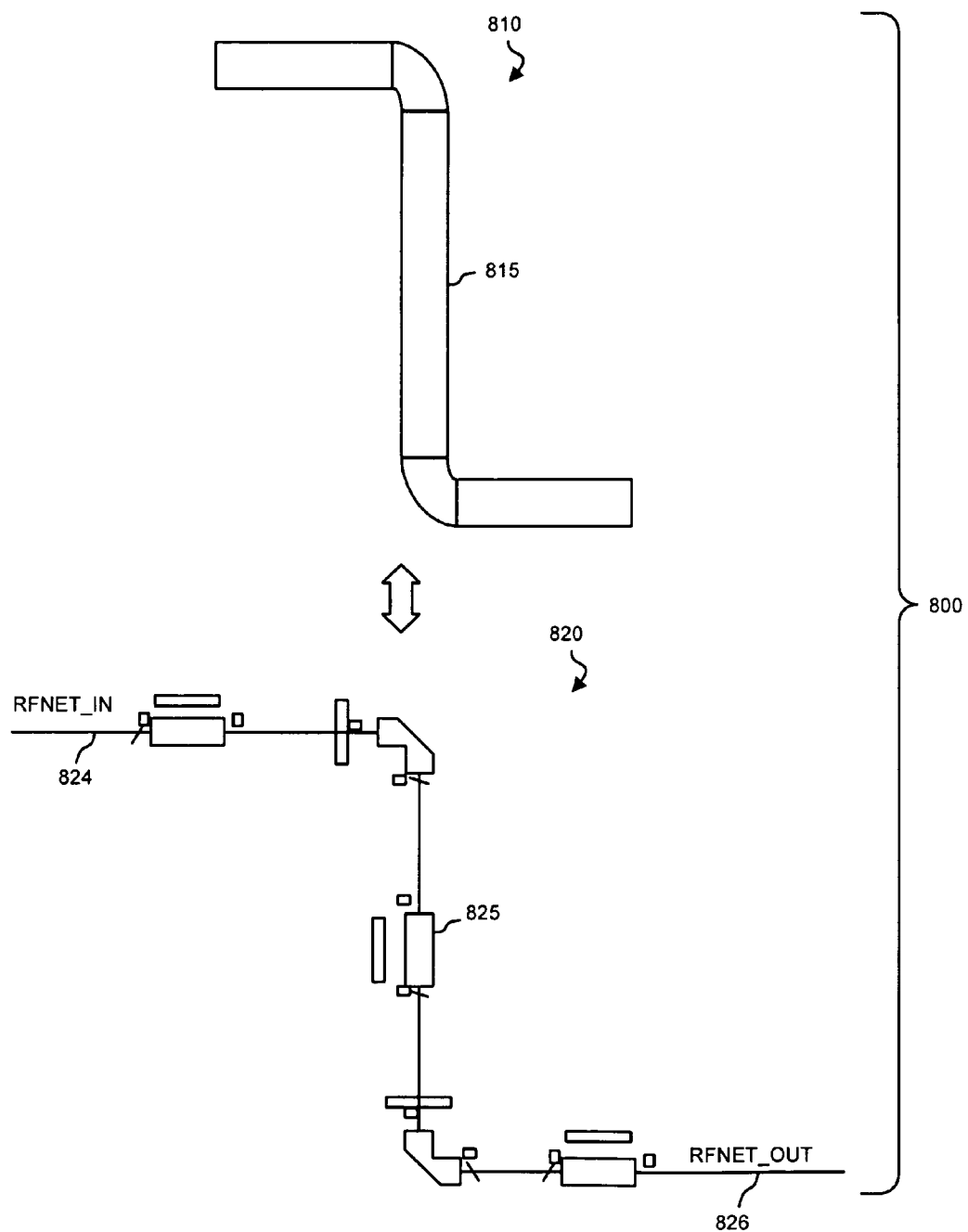
FIG. 8A is an exemplary drawing sheet of an extended net in accordance with an embodiment of the present general inventive concept.

In certain embodiments of the present invention, an RF XNet may be inserted into a design as an RF drawing sheet. A graphical representation of exemplary RF sheet 800 is illustrated in FIG. 8A, and includes a physical schedule 810 and a logical schedule 820. As used herein, a schedule is a description of the manner in which circuit connections are constructed. In FIG. 8A, the physical schedule 810 may implement the physical data 297 in FIG. 2B, and the logical schedule 820 may implement the logical data 295 in FIG. 2B. Additionally, the net connection RFNET_IN, represented at connection stub 824, and the net connection RFNET_OUT, represented at connection stub 826, may implement addresses 296 and 298, respectively, in FIG. 2B. The physical construction of a circuit connection may be completely defined in a logical schedule 820. For example, modifications to coupled line 825 in the schematic data abstraction of logical schedule 820 are transferred to the physical schedule 810 by forward-annotation and, ultimately, to the fabricated circuit.

Figure 8B:
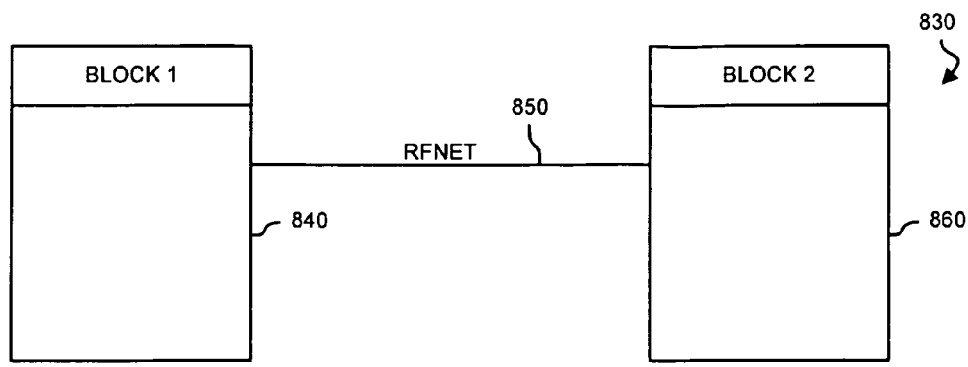
FIG. 8B is an exemplary circuit in which to insert the drawing sheet of FIG. 8A.
Figure 8C:
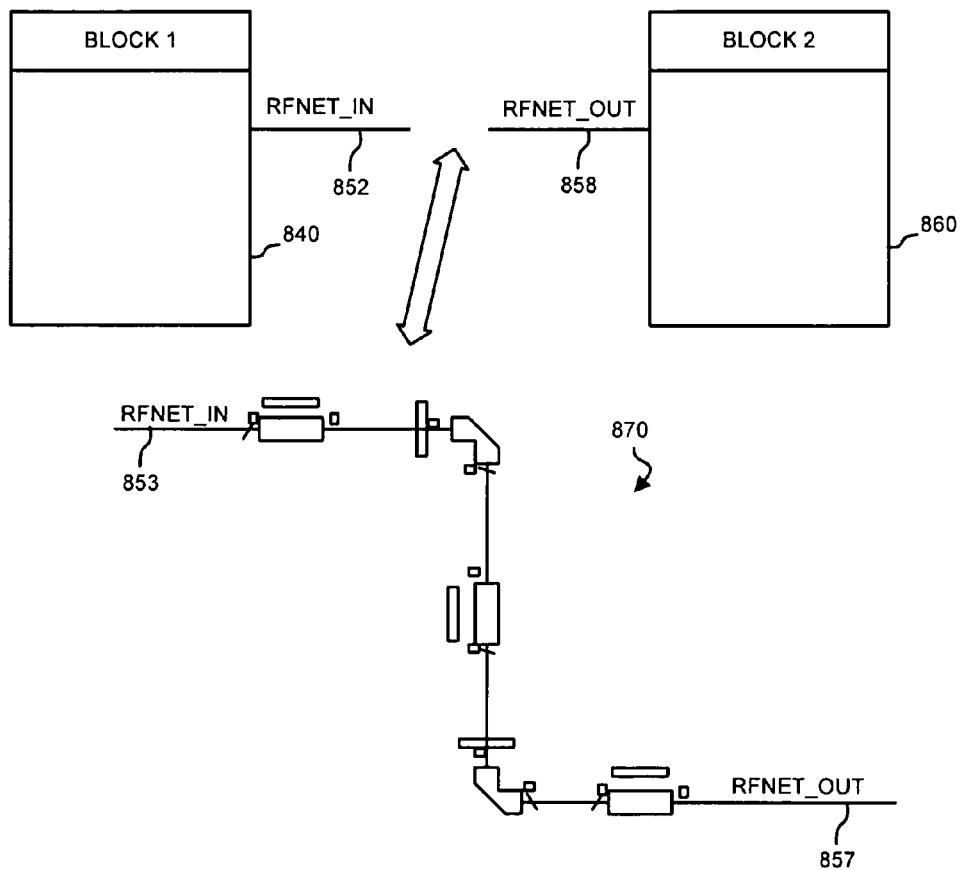
FIG. 8C is a diagram of an exemplary drawing sheet insertion technique in accordance with an embodiment of the present general inventive concept.

Referring to FIG. 8B, there is illustrated a circuit 830 in which a block 840 and a block 860 are connected by an RF net 850. In certain embodiments of the present invention, the RF net 850 can be incorporated into the circuit design by way of an RF sheet 870. For example, as illustrated in FIG. 8C, the RF net 850 may be abutted at each block 840 and 860 through connections 852 and 858, respectively. The connection 852 on block 840 may be modified by the designer to connect to the net RFNET_IN and the connection on block 860 may be modified to connect to the net RFNET_OUT. The nets RFNET_IN and RFNET_OUT are connected at nets 853 and 857, respectively, in the RF sheet 870 by, for example, linking addresses of the respective connections on blocks 840 and 860 with the addresses of the nets RFNET_IN and RFNET_OUT in the RF sheet 870, such as described with reference to FIG. 2B. Accordingly, any modification to the data in RF sheet 870 is a modification to the circuit 830.

Figure 8D:
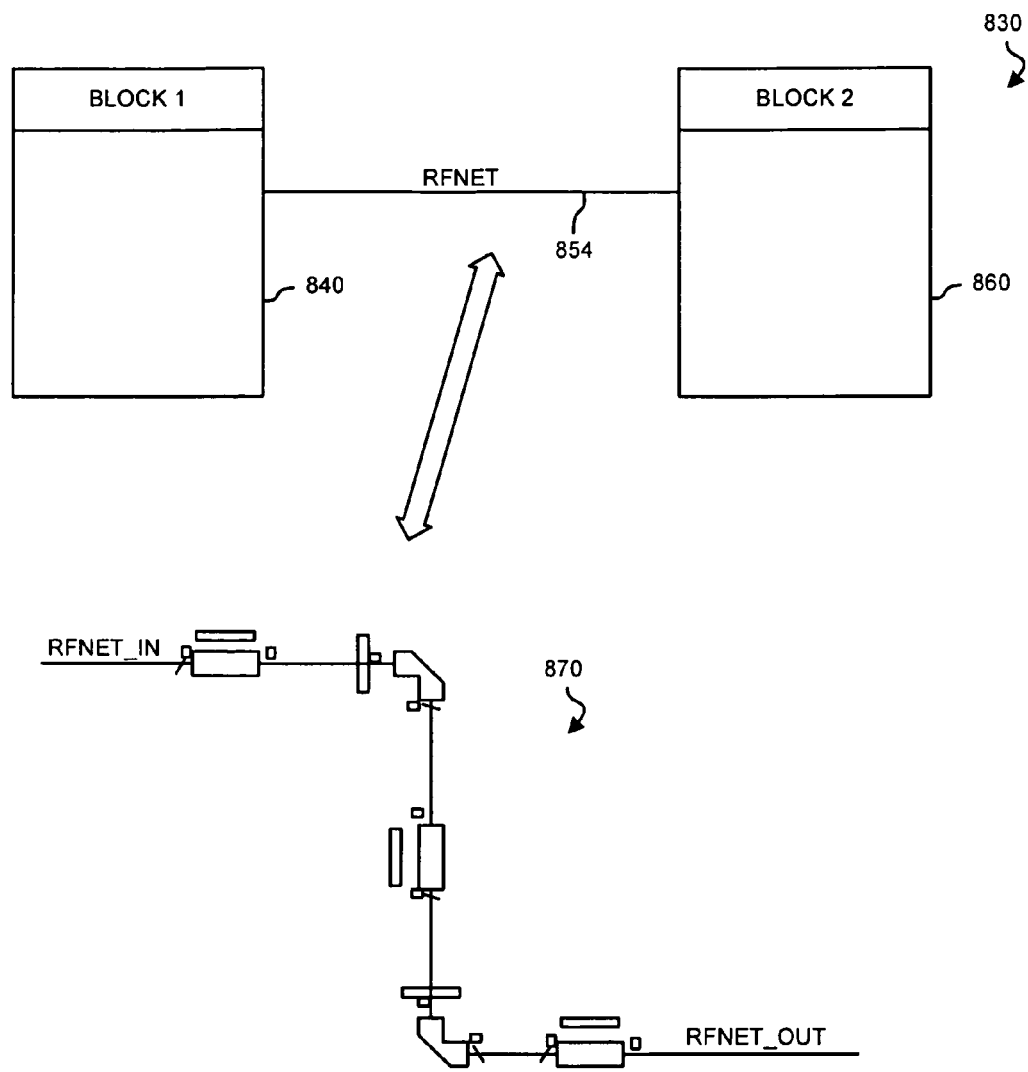
FIG. 8D is a diagram of an exemplary alternative drawing sheet incorporation technique in accordance with an embodiment of the present general inventive concept.

FIG. 8D illustrates an alternative methodology by which drawing sheets may be used with the present invention. In the illustrated example of FIG. 8D, the RF sheet 870 is assigned as a property sheet of net 854. Accordingly, any modification to RF net 854 invokes a schematic editor of CDS 350 (not illustrated) in which the RF sheet 870 is presented for editing. The edited RF sheet 870 may be saved in, for example, the design database 387 as a circuit object and the stored data may ultimately be used to fabricate the circuit 830.

In certain embodiments of the present invention, instances of electrical structures are used repeatedly, parameterized in accordance with a context in which individual instances are placed, and organized in a hierarchy of design data. Such hierarchy may be implanted through suitable hardware description language macros so as to relieve the designer of arduous graphical manipulations that would otherwise be required.

Figure 9A:
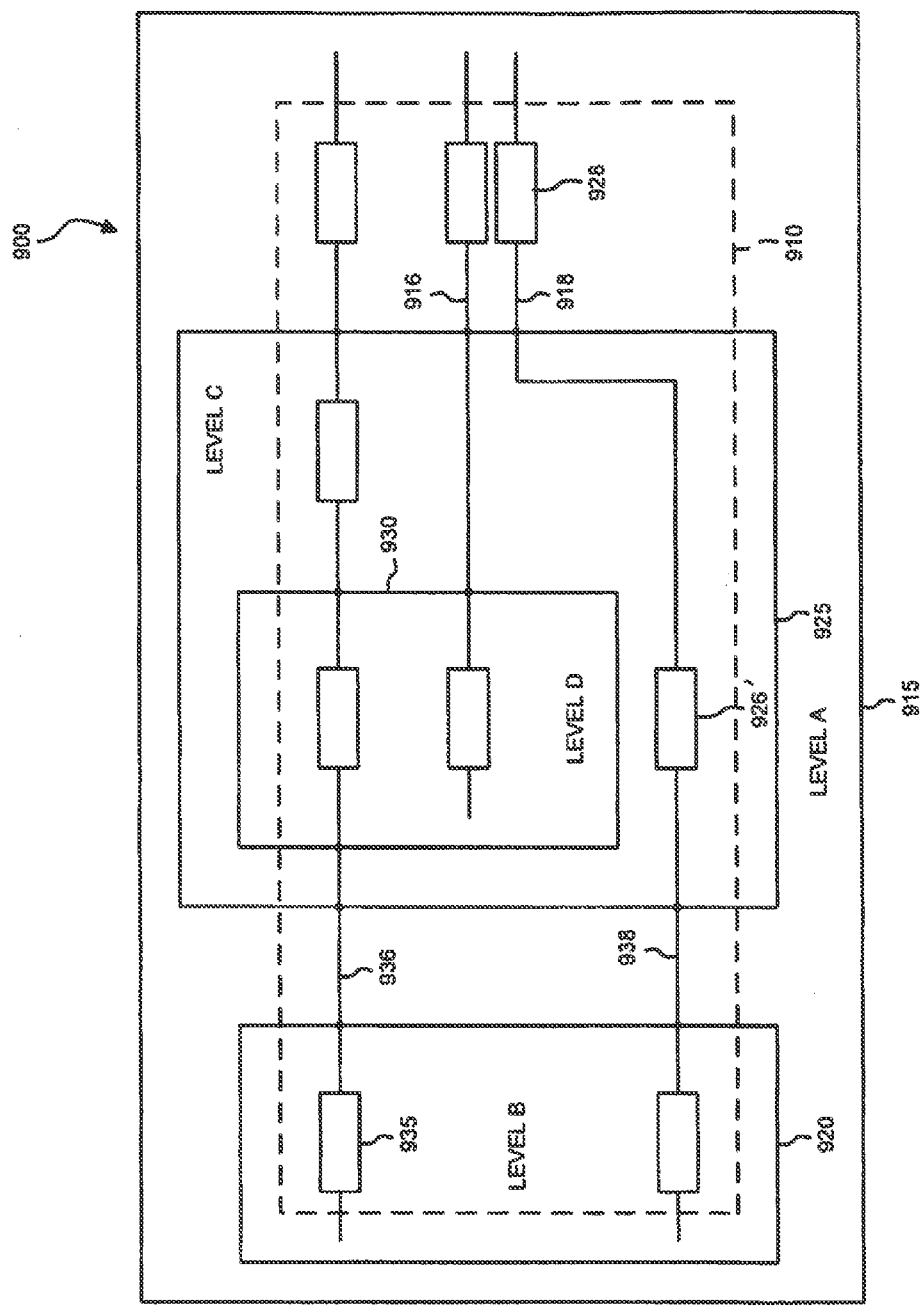
FIG. 9A is a diagram of a hierarchical schematic data abstraction in which an XNet spans multiple levels of the hierarchy in accordance with an embodiment of the present general inventive concept.

Illustrated in FIG. 9A is a schematic data abstraction of a hierarchical circuit design 900. The exemplary hierarchy contains four levels 915, 920, 925, and 930, although the present invention is not limited by the number of levels in a hierarchical circuit design. Connections between components, representatively illustrated at component 935, at different hierarchical levels 915, 920, 925, and 930 may be achieved by interface connections, representatively illustrated at interface connections 916, 918, 936, and 938

In certain embodiments of the present invention, an XNet 910 includes components 935 that reside across multiple levels of the hierarchical circuit design 900. Additionally, the logical topology of the XNet 910 may be such as to convey a user-identifiable characteristic, such as by application of a schematic topology template described with reference to FIGS. 5A-5E. A modification to the layout data abstraction of the XNet 910 may undesirably disarrange the legible and understandable schematic data abstraction thereof. An exemplary modification to the physical data abstraction of the XNet 910 is illustrated in FIG. 9B. It is to be noted that the illustration of FIG. 9B is not a true depiction of a layout data abstraction, but is illustrated in the logical topology in the interest of clearly portraying and describing the modification process.

In FIG. 9B, electrical structures 940', 945', 950', 955' and 960' are to be added to the XNet 910 via the layout data abstraction thereof. The layout data abstraction is flat, i.e., all member components are located on a single design layer. Thus, in certain embodiments of the present invention, the relative locations of the interface connections 916, 918, 936, and 938 of the schematic data abstraction are translated to connecting structures in the layout data abstraction, as illustrated in FIG. 9B.

In accordance with an embodiment of the present invention, the assignments of the added electrical structures 940', 945', 950', 955' and 960' to the hierarchical levels 915, 920, 925, and 930 are made through automated machine operations of the CDS 350, based on the connectivity of the added electrical structures 940', 945', 950', 955' and 960'. For example, the placement of electrical structure 940' is such that one connection thereto is via the interface connection 936, and the opposing connection thereto is via a non-interface connection to electrical structure 935'. In the exemplary embodiment of the present invention, automated machine operations place a component in the scenario demonstrated by the placement of electrical structure 940' at the hierarchical level corresponding to the non-interface connection.

Accordingly, the representation 940 of electrical structure 940' is placed in hierarchical level 920, as illustrated in FIG. 9B.

The addition of electrical structures 945', 950', and 955' present a slightly different scenario. Whereas the placement of representation 945 corresponding to added electrical structure 945' is placed in accordance with the same placement determination as that of representation 940, the complete connectivity of representation 950, i.e., which pin of the representation 950 is connected to a non-interface connection and which, if any, are not, cannot be known prior to the hierarchical placement of representation 955. Accordingly, representation 955 may be placed prior to the placement determination of representation 950. Since electrical structure 955' is connected via a non-interface connection to electrical structure 926', the representation 955 is placed at the hierarchical level 925 of the non-interface connection. Added electrical structure 950' is then determined to have a non-interface connection to electrical structure 955' and an interface connection to the electrical structure 945', the representation 950 is placed at hierarchical level 925.

Added electrical structure 960' is a set of microstrip asymmetrical coupled lines, or MACLIN, connected to microstrip line segment 937', or MLIN, at the hierarchical level 930 and to MLIN 926' at another hierarchical level 925. Thus, given the connectivity of MACLIN 960, the representation 960 thereof may be validly placed at any one of the hierarchical levels 915, 925, and 930. Thus, the placement of representation 960 is ambiguous. In certain embodiments of the present invention, ambiguous symbol placement is set to the lowest common ancestor level of the hierarchy, which in the illustrated example, is the top-most level 915. To maintain the hierarchical interface connectivity, the original interface connections 916 and 918 remain in place, as is illustrated in FIG. 9C, and new interface connections 912 and 914 are added.

Figure 9D:
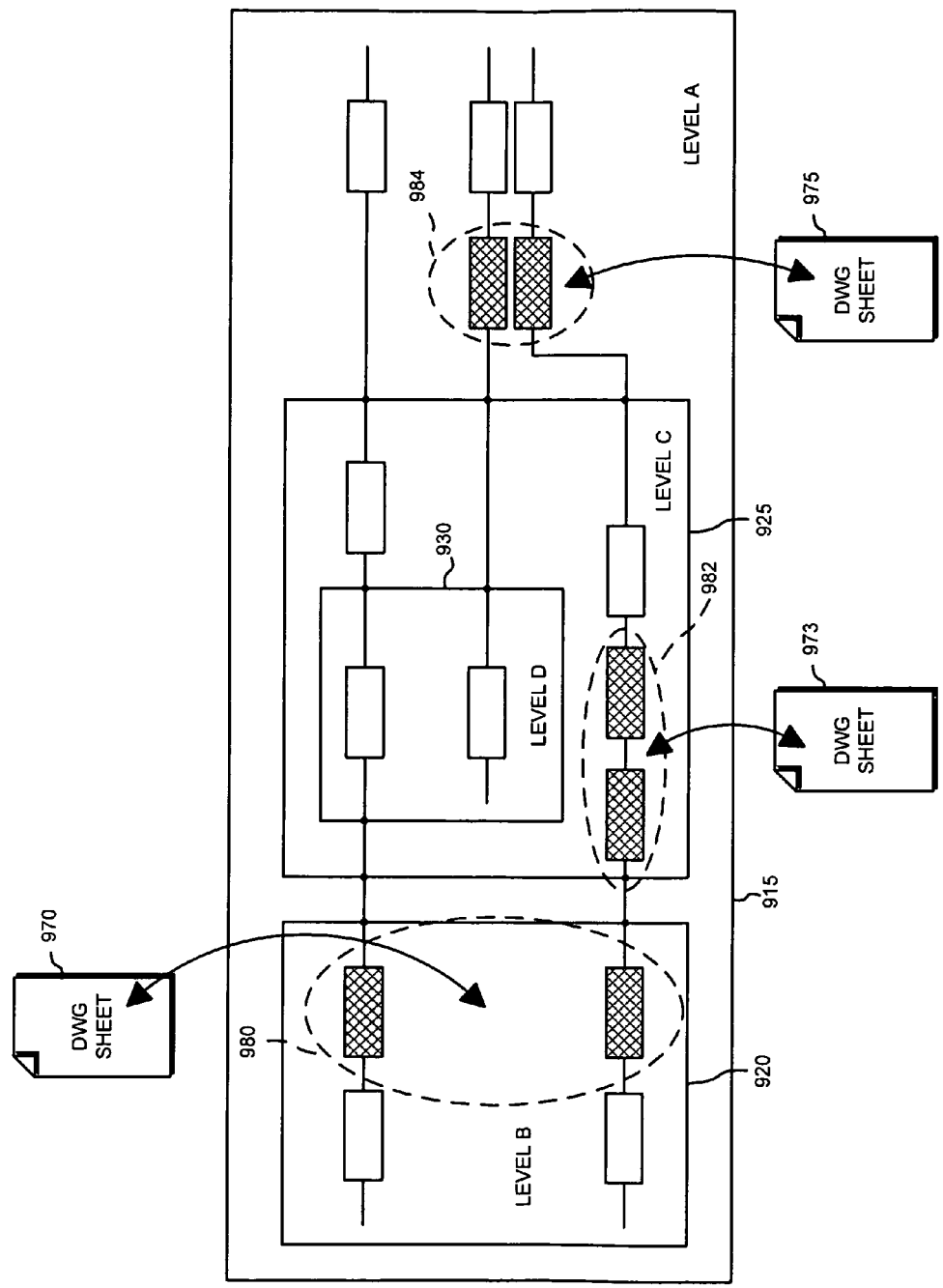
FIGS. 9D and 9E are illustrations of drawing sheet assignments of the added structures in accordance with an embodiment of the present general inventive concept.
Figure 9E:
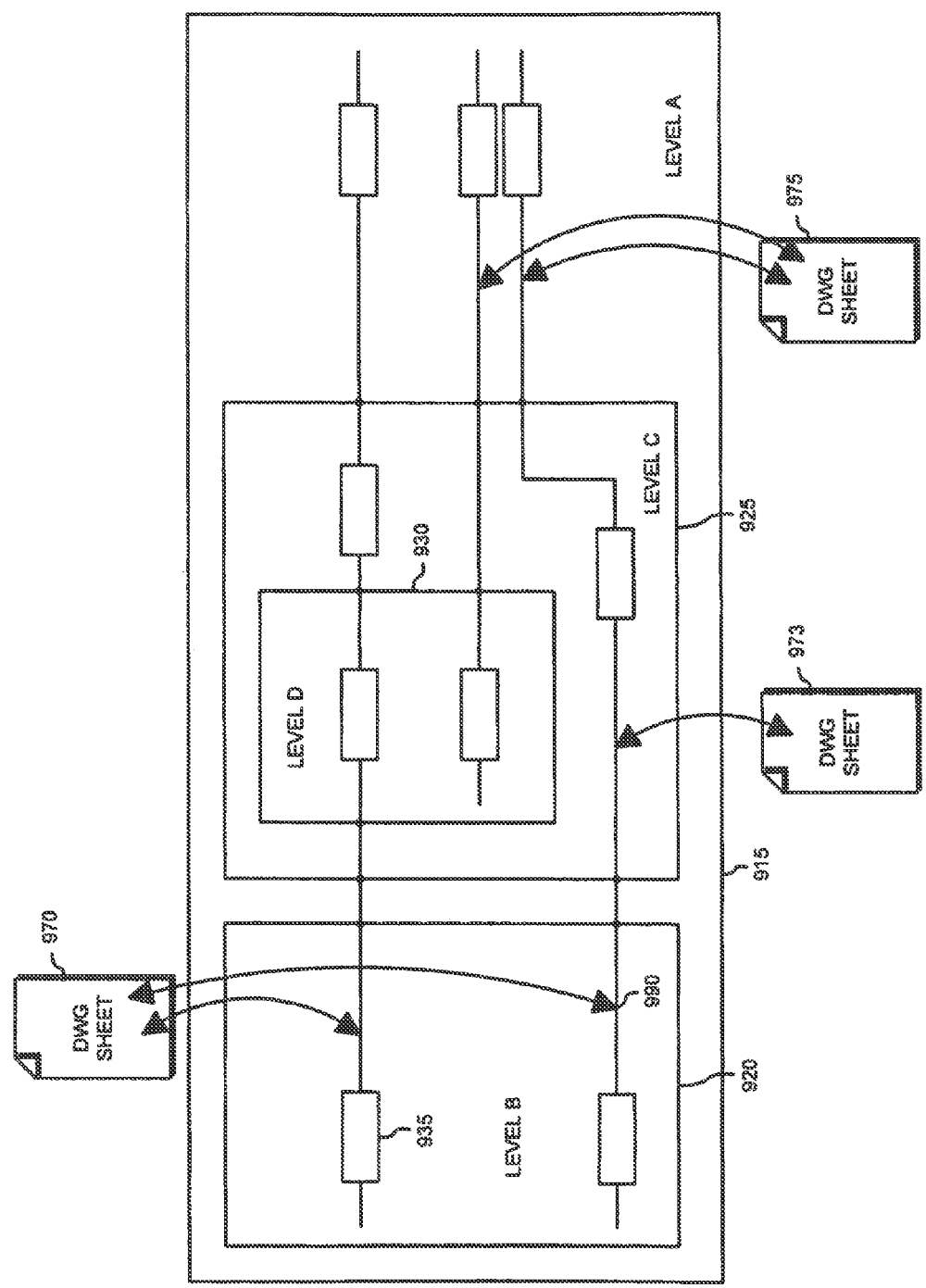

The representations 940, 945, 950, 955 and 960 of the added electrical structures 940', 945', 950', 955' and 960' may be assigned to drawing sheet data structures, as illustrated in FIG. 9D. In certain embodiments of the present invention, the added representations on different hierarchical layers are assigned to corresponding drawing sheet data structure. As is illustrated in FIG. 9D, the added representations 980 at level 920 are assigned to drawing sheet data structure 970, representations 982 at hierarchical level 925 are assigned to drawing sheet data structure 973, and representation 984 at level 915 is assigned to drawing sheet 975. When the added representations and the physical data corresponding thereto are assigned to the drawing sheet data structures 970, 973 and 975, drawing sheet insertion mechanisms, such as those described with reference to FIGS. 5A-5E, the hierarchical design data can remain legible and arranged, even when components are added. For example, as illustrated in FIG. 9E, the drawing sheets may be assigned as property sheets of the design data such that addressing a net, such as is indicated at point 990, will obtain the corresponding drawing sheet data structure 970, and the contents thereof, i.e., the simple XNets illustrated at grouping 980 in FIG. 9D, are displayed to the user. Accordingly, the schematic data abstraction can be presented in its original form, as demonstrated by FIGS. 9A and 9E.

Figure 10:
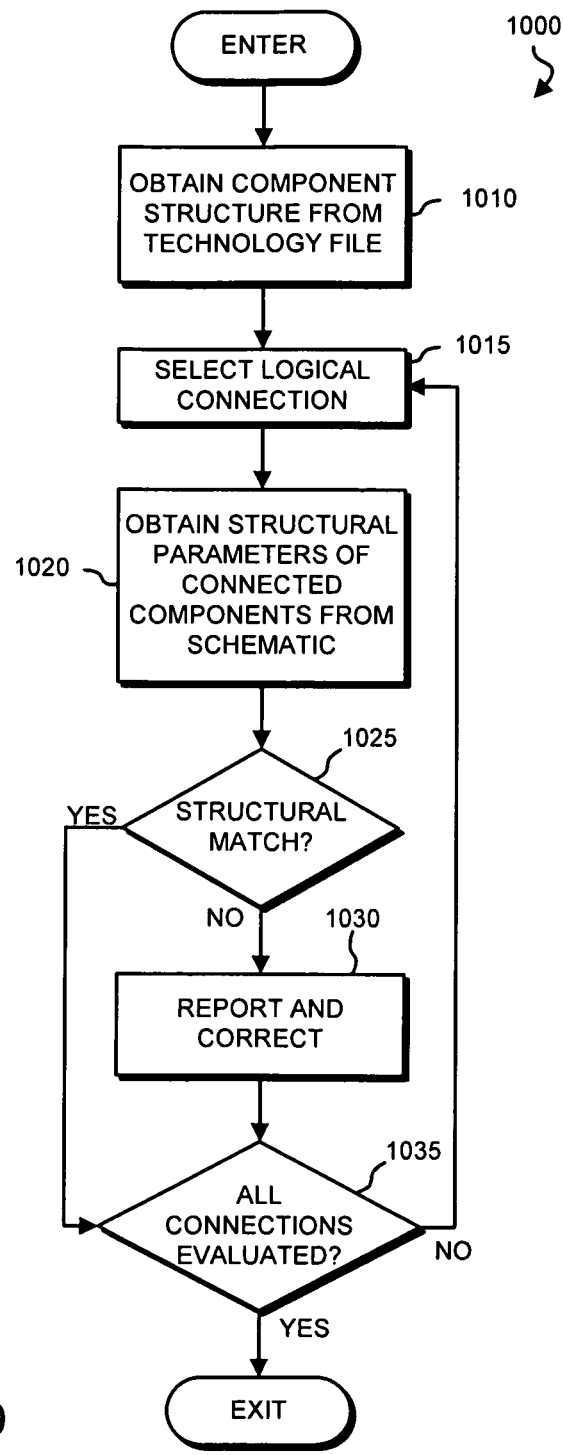
FIG. 10 is an exemplary front-end structural verification process in accordance with an embodiment of the present general inventive concept.

The exemplary CDS 350 includes a front-end verification processor 379 to perform design verification processes on the schematic abstraction of the data. Such verification affords correction of structural errors as a front-end process prior to computationally intensive geometric processing of the circuit data into a layout. An exemplary front-end design verification process 1000 is illustrated in FIG. 10. In operation 1010, the structural details of the entire design are obtained from, for example, a technology file that defines fabrication process parameters that the circuit of interest has in common with the design. Such parameters include, but are not limited to, material parameters, sheet resistances and conductivities, layer thicknesses, and other parameters. Certain applications will allow more than one fabrication technology, such as a system-in-package (SiP) design in which printed circuit technology is combined with integrated circuit technology. In such cases, the technology file that pertains to the sub-circuit being verified is that which is consulted in operation 1010.

In operation 1015, a logical connection between RF components is selected and in operation 1020, the structural parameters assigned to the components connected by the selected logical connection are obtained from the extended schematic data abstraction. Such parameters may be those described with reference to the topology file 430 described above such as, for example, microstrip line width. In operation 1025, the parameters are used to determine whether there is a structural match between the logically connected components. For example, a microstrip line should have like width as a mitered bend to which it is connected so as to form a contiguous electrical structure. If it is determined that there is a structural error between components, such is reported to the user in operation 1030 and a correction therefor is either sought from the user, or may be automatically corrected in accordance with predefined rules. For example, widths may be corrected to form a contiguous electrical structure or a via may be added to connect disparate structures, such as connecting a strip line with a microstrip line. In certain embodiments of the present invention, the user may set a system parameter that informs the system to correct certain simple errors, such as width mismatches, without prompting the user. In operation 1035, it is determined whether all logical connections have been traversed and, if not, the process 1000 iterates from operation 1015. Otherwise, the process 1000 exits.

The exemplary CDS 350 includes a topology processor 377 to rearrange the physical topology of the defined in the layout data abstraction to a topology that lends itself to be more easily read and understood by a designer. A logical schedule that retains the topology of the corresponding physical schedule may be essentially unreadable when presented to a designer. The topology processor 377 may execute automated machine instructions to implement the template application process described with reference to FIGS. 5C-5D.

The exemplary CDS 350 includes an annotation processor 375 to perform back-annotation processes to synchronize a logical data abstraction with changes to the corresponding physical data abstraction and to perform forward-annotation process to synchronize the physical data abstraction with changes to the corresponding logical data abstraction. In certain embodiments of the present invention, the back-annotation process, and similarly the forward-annotation process, updates structural parameters in the logical data abstraction across sub-circuits in the design. For example, if changes to an RF XNet in one portion of a design require corresponding changes to, for example, another RF XNet in a separate RF sheet of the design, the annotation processor 375 performs suitable back-annotation processes to update the RF sheet based on the changes to the changes to the RF XNet.

The annotation processor 375 may also implement functions by which previously created RF topologies may be inserted into a circuit design. For example, as discussed with reference to FIG. 8B-8D, an incorporation of a logical schedule 870 into a circuit design 830 may be accompanied by a corresponding forward-annotation of the physical schedule into the circuit design.

Figure 11:
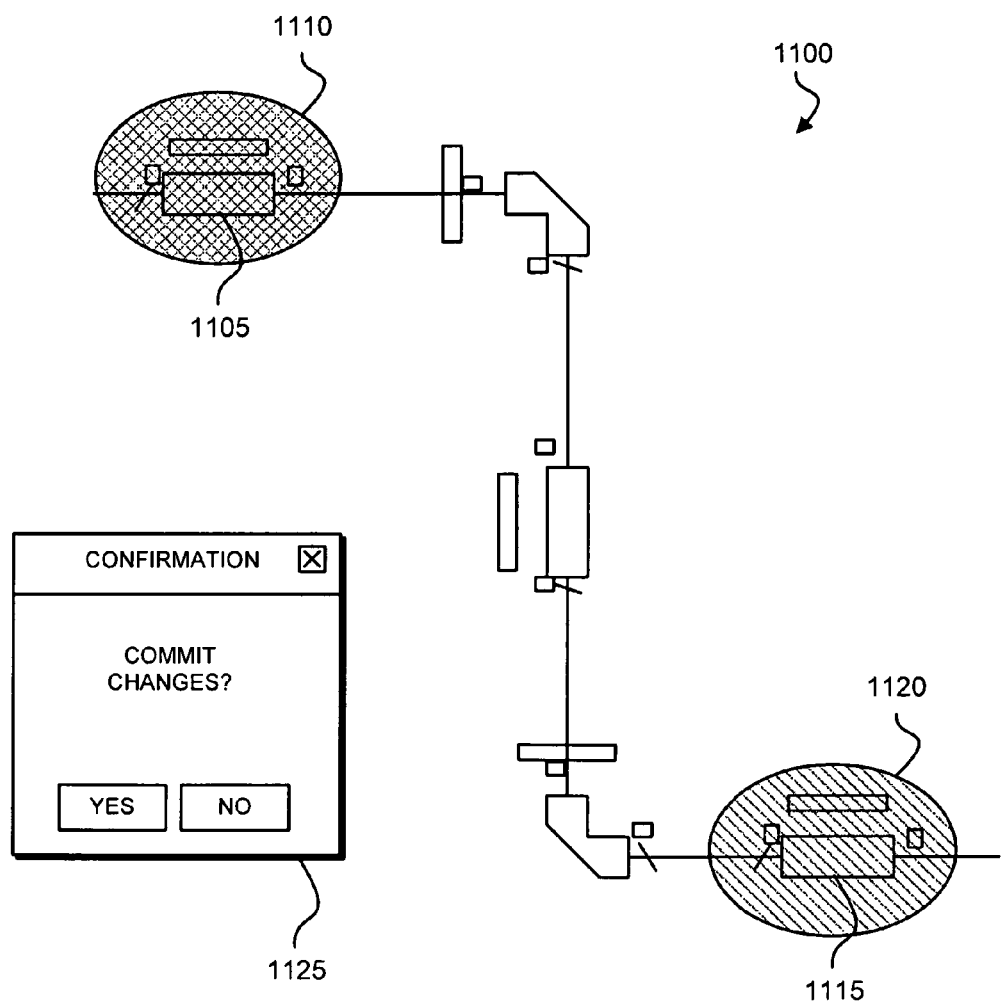
FIG. 11 is a diagram of an exemplary back-annotation preview in accordance with an embodiment of the present general inventive concept.

In certain embodiments of the present invention, the annotation processor 375 includes a preview mechanism by which updated data circuit may be previewed prior to committing the change to the design. The preview mechanism may be achieved by, for example, suitable graphical coding, such as color coding on a display whereby changes to parameters of a component are presented in respective colors. For example, as illustrated in FIG. 11, a preview of RF XNet 1100 is presented on the display interface 367. As a result of a change in the design, component 1105 requires a change to, for example, a width of a conductor strip and component 1115 requires a change to, for example, coupling in a coupled line. Each type of change may be presented in a different color or shading, such as indicated by shading 1110 and 1120. For example, new connections may be displayed in yellow, changes to component properties may be presented in purple, and added components may be presented in blue. If a designer agrees to the changes presented in the preview of the RF XNet 1100, the designer may activate a control 1125 to commit the changes to the design. Alternatively, the designer may deactivate the preview mechanism, whereby the changes are committed to without additional user interaction.

The exemplary work space 397 is provided to temporarily store data, including temporary file structures, during various data processing procedures. For example, various data abstractions of the circuit data may be rendered into the work space 397 prior to being presented to the designer on the user interface 365. The work space 397 may be allocated from, for example, data memory 344. The present invention is limited neither by the construction of the work space 397 nor by the manner in which the work space 397 is allocated. Any number of suitable data storage techniques may be used with the present invention without deviating from the spirit or intended scope thereof.

Certain embodiments of the present invention provide for functional components thereof to be manufactured, transported, marketed and/or sold as machine instructions encoded on machine-readable media. The present general inventive concept, when so embodied, can be practiced regardless of the processing platform on which the machine instructions are executed and regardless of the manner by which the machine instructions are encoded on the machine-readable medium.

It is to be understood that the machine-readable medium discussed in the paragraph above may be any medium on which the instructions may be encoded and then subsequently retrieved, decoded and executed by a processor, including electrical, magnetic and optical storage devices, and wired, wireless, optical and acoustical communication channels. The machine-readable medium may be a computer-readable medium that includes either or both of persistent storage, referred to herein as "computer-readable recording media" and as spatiotemporal storage, referred to herein as "computer-readable transmission media". Examples of computer-readable recording media include, but not limited to, read-only memory (ROM), random-access memory (RAM), and other electrical storage; CD-ROM, DVD, and other optical storage; and magnetic tape, floppy disks, hard disks and other magnetic storage. The computer-readable recording media may be distributed across components, to include such distribution through storage systems interconnected through a communication network. The computer-readable transmission media may transmit encoded instructions on electromagnetic carrier waves or signals, or as acoustic signals through acoustically transmissive media. Moreover, the processor instructions may be derived from algorithmic constructions of the present general inventive concept in various programming languages, the mere contemplation of which illustrates the numerous realizable abstractions of the present general inventive concept.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

What is claimed is:

1. An apparatus to design a physical system of components, the design of the physical system including modifiable design data that, when compliant with established design criteria, describe a realization of the physical system, the apparatus comprising:
   a database to store the design data defining physical structure of each of the components and defining a physical topology specifying a location in the physical system of each of the components, the database further to store a plurality of predefined topology templates, each defining a schematic topology specifying relative locations of graphical representations of the components in a schematic data abstraction of the design data;
   a user interface to accept design instructions from a user including a selection of a topology template from the predefined topology templates; and
   a processor executing to generate a logical topology by mapping the location of each component in the physical topology to a location of the graphical representation of the corresponding one of the components in the schematic topology, and rearranging one or more of the physical topology components according to the selected topology template;
   the processor further executing to store the mapped locations of each of the components in the design data;
   the logical topology defining an interconnection of the components, having a relative placement of components different from a relative placement of the components in the physical topology, and including a mixture of representations for the components in schematic and physical topology forms.

2. The apparatus as recited in claim 1, wherein each of the predefined topology templates defines a corresponding schematic topology that conveys a user-identifiable characteristic to the user.

3. The apparatus as recited in claim 2, wherein the user interface displays to the user a listing of the predefined topology templates in the database prior to the selection of the topology template therefrom.

4. The apparatus as recited in claim 3, wherein the predefined topology templates are listed on the user interface by indicia indicative of the user-identifiable characteristic.

5. The apparatus as recited in claim 4, wherein the indicia form a character string describing the user-identifiable characteristic.

6. The apparatus as recited in claim 1, wherein the user interface displays the graphical representations of the components in a logical data abstraction of the design data.

7. The apparatus as recited in claim 1, wherein the processor establishes a location data field in the design data for each of the components, correlates the components with the graphical representations thereof described in the selected topology template, and assigns coordinate values stored in the selected topology template for each of the graphical representations of the components to the location data field of the corresponding component.

8. The apparatus as recited in claim 7, wherein upon an ambiguous correlation of the graphical representations of the components in the selected topology template to the corresponding component, the processor transmits an indicating signal and, in response thereto, the user interface displays a user control to permit the user to resolve the ambiguity.

9. The apparatus as recited in claim 7, wherein the processor creates a drawing sheet data structure to contain the design data with the coordinate values assigned in accordance with the selected topology template, the drawing sheet data structure including a sheet address by which the drawing sheet data structure is accessed, the drawing sheet data structure being stored in a non-transitory machine-readable medium.

10. The apparatus as recited in claim 9, wherein the user provides at least one design instruction to incorporate the drawing sheet into the design data, the processor asserts a signal upon modification of any component in the physical system resulting from a back-annotation of the logical data abstraction thereof with the design data in the drawing sheet and, in response to the signal, the user interface displays the logical data abstraction of the design data to include graphical indicators indicating the component that was modified.

11. The apparatus as recited in claim 10, where the graphical indicators indicating the modified component comply with a predetermined graphical code indicative of a manner in which the component is modified.

12. The apparatus as recited in claim 11, where the signal asserted by the processor instructs the user interface to display a user control thereon to query the user as to whether the modifications to the design data as indicated by the graphical indicators are to be committed to the design data, where user activation of the user control affirms or denies the committing of the modifications to the design data.

13. The apparatus as recited in claim 1, wherein the physical system is an electrical circuit, the physical structure of each of the components is that of a corresponding electrical structure, and the topology templates are schematic topology templates that define the relative locations in the logical data abstraction of the graphical representation of electrical components formed by the electrical structures, and where the processor includes:
   a circuit data processor to partition extended net design data from the physical topology of the design data to form an extended net of the electrical circuit, the extended net design data including structure data of each of respective electrical structures that are members of the extended net, connection data describing connectivity of the electrical structures of the extended net, and an address by which the extended net design data is linked to the design data of the electrical circuit; and
   a topology processor to execute the mapping of the location of each member electrical structure of the extended net in the physical topology to a location of the graphical representation of the corresponding one of the electrical structures in the logical topology as defined in the selected schematic topology template, the topology processor further to store the mapped locations of each of the member electrical structures in the extended net design data.

14. The apparatus as recited in claim 13, where the user interface displays a listing of the plurality of schematic topology templates prior to the selection of the schematic topology template, the listing includes an indication of the logical topology of each of the schematic topology templates in a manner that conveys a user-identifiable characteristic of the extended net, the user selects the schematic topology template that conveys the user-identifiable characteristic corresponding to user knowledge of the extended net.

15. The apparatus as recited in claim 13 including:
an annotation processor to back-annotate the logical data abstraction of the design data of the electrical circuit other than the electrical circuit from which the extended net was partitioned upon an indication that the member electrical structures described by the extended net design data are added to the layout data abstraction of the design data of the other electrical circuit.

16. The apparatus as recited in claim 13, where the electrical structures include radio frequency transmission line segments.

17. A method executed by a user-operated machine to design a physical system of components, the design of the physical system including modifiable design data that, when compliant with established design criteria, describe a realization of the physical system, the method comprising:
partitioning subsystem design data of at least one subsystem of the physical system from the design data, the partitioned subsystem design data establishing a physical topology by which a location of each of the components that are members of the subsystem defined by the subsystem design data is specified;
selecting a topology template from a plurality of predefined topology templates, each defining a schematic topology specifying relative locations of graphical representations of the member components of the subsystem in a schematic data abstraction of the subsystem design data;
generating a logical topology by mapping the location of each member component in the physical topology to a location in the schematic topology, and rearranging one or more of the physical topology components according to the selected topology template, the logical topology defining an interconnection of components, having a relative placement of components different from the physical topology, and including a mixture of representations for the components in schematic and physical topology forms, where the corresponding graphical representation of each member component is located in accordance with the selected topology template;
including as a data item of the subsystem design data the mapped locations of each of the member components; and
displaying to the user the generated logical topology on a display device.

18. The method as recited in claim 17, where the selecting of the topology template includes:
displaying to the user a listing of the predefined topology templates stored in a non-transitory machine-readable medium, the listing including an identifiable characteristic conveyed by the logical topology defined in each of the predefined topology templates, the identifiable characteristic being understood by the user in the context of the design of the physical system; and
selecting the topology template in which the identifiable characteristic corresponds to at least one characteristic of the subsystem.

19. The method as recited in claim 17, including:
storing the mapped subsystem design data in a non-transitory machine-readable medium.

20. The method as recited in claim 19, including:
constructing a drawing sheet data structure for the subsystem design data of each of a plurality of subsystems partitioned from the physical system;
storing the mapped subsystem design data of each of the subsystems in a corresponding drawing sheet data structure such that a data addressing operation by the user-operated machine to access a data item of one of the mapped subsystem designs retrieves from the tangible machine-readable medium the corresponding drawing sheet data structure in which the data item is stored.

21. The method as recited in claim 20, including:
modifying the physical data abstraction of the design data corresponding to at least one of the components of the physical system;
retrieving the drawing sheet data structure containing the subsystem design data affected by the modification;
performing a corresponding modification to the logical data abstraction of exclusively the subsystem design data contained in the retrieved drawing sheet.

22. The method as recited in claim 21, where the displaying of the mapped subsystem design data includes:
indicating the modification in the logical data abstraction of the mapped subsystem design data in accordance with a graphical code indicative of a manner in which the design data was modified.

23. The method as recited in claim 22 including:
presenting a user control on a user interface of the user-operated machine to request from the user whether modifications to the design data as indicated by the graphical indicators are to be committed to the design data; and
committing the changes to the design data only upon user confirmation to do so by activation by the user of the user control.

24. The method as recited in claim 17, where the partitioning of the subsystem design data includes:
selecting one of the components from the physical topology of the design data;
adding the component data and connection data of the selected one of the components to the subsystem design data, the connection data defining connectivity of the selected component with other components in the physical system;
selecting a next one of the components as the selected one of the components; and
repeating the method at the adding of the component data and the connection data until a user operating the machine affirms that the subsystem is a suitable partition of the physical system.

25. The method as recited in claim 24 including:
establishing the physical system as an electrical circuit, a physical structure of each of the components as that of a corresponding electrical structure, and the topology templates as schematic topology templates that define the relative locations of the graphical representation of electrical components formed by the electrical structures;
encountering an electrical device during the selecting, the adding, and the repeating of the partitioning of the subsystem design data, the electrical device produced by a fabrication process other than the fabrication process by which the electrical structures are produced; and adding the electrical device to the subsystem design data according to an instruction to do so provided by the user.

26. The method as recited in claim 25 including:
establishing the fabrication process by which the electrical structures are produced to be one that produces radio frequency transmission line segments, and the fabrication process of the electrical device to be one that produces active electronic devices or encapsulated passive devices.

27. A non-transitory machine-readable medium having encoded thereon instructions that, when executed by a user-operated machine, performs a method comprising:
partitioning subsystem design data of at least one subsystem of a physical system from the design data, the partitioned subsystem design data establishing a physical topology by which a location of each component that is a member of the subsystem defined by the subsystem design data is specified;
selecting a topology template from a plurality of pre-defined topology templates, each defining a schematic topology specifying relative locations of graphical representations of the member components of the subsystem in a schematic data abstraction of the subsystem design data;
generating a logical topology by mapping the location of each member component in the physical topology to a location in the schematic topology, and rearranging one or more of the physical topology components according to the selected topology template, the logical topology defining an interconnection of components, having a relative placement of components different from the physical topology, and including a mixture of representations for the components in schematic and physical topology forms, where the corresponding graphical representation of each member component is located in accordance with the selected topology template;
including as a data item of the subsystem design data the mapped locations of each of the member components; and
displaying to the user the generated logical topology on a display device.

* * * * *